US007102380B2

(12) United States Patent
Kao

(10) Patent No.: US 7,102,380 B2
(45) Date of Patent: Sep. 5, 2006

(54) HIGH SPEED INTEGRATED CIRCUIT

(76) Inventor: Richard F. C. Kao, 6051 Prince Dr., San Jose, CA (US) 95129

( * ) Notice: Subject to any disclaimer, the term of this patent is extended or adjusted under 35 U.S.C. 154(b) by 1 day.

(21) Appl. No.: 10/887,363

(22) Filed: Jul. 7, 2004

(65) Prior Publication Data

US 2006/0017462 A1  Jan. 26, 2006

(51) Int. Cl.
*H03K 17/16* (2006.01)
(52) U.S. Cl. .............................. 326/26; 326/83; 326/30
(58) Field of Classification Search ............ 326/26–28, 326/30, 82–87, 89
See application file for complete search history.

(56) References Cited

U.S. PATENT DOCUMENTS

| | | | |
|---|---|---|---|
| 4,782,300 A | 11/1988 | Bonaccio et al. | |
| 5,121,080 A | 6/1992 | Scott, III | |
| 5,185,538 A | 2/1993 | Kondoh et al. | |
| 5,315,175 A | 5/1994 | Langner | |
| 5,382,838 A | 1/1995 | Sasaki et al. | |
| 5,440,515 A | 8/1995 | Chang et al. | |
| 5,479,124 A | 12/1995 | Pun et al. | |
| 5,541,957 A | 7/1996 | Lau | |
| 5,585,763 A | 12/1996 | Navabi et al. | |
| 5,687,330 A | 11/1997 | Gist et al. | |
| 5,838,723 A | 11/1998 | Mack et al. | |
| 6,100,717 A | 8/2000 | May | |
| 6,163,579 A | 12/2000 | Harrington et al. | |
| 6,211,719 B1 | 4/2001 | deBrigard | |
| 6,218,872 B1 | 4/2001 | Koren | |
| 6,373,277 B1 | 4/2002 | Felder | |
| 6,459,323 B1 * | 10/2002 | Birkeli | ........................ 327/333 |
| 6,678,721 B1 | 1/2004 | Bell | |
| 6,683,472 B1 * | 1/2004 | Best et al. | ...................... 326/30 |
| 6,721,379 B1 | 4/2004 | Cranford, Jr. et al. | |
| 6,724,219 B1 | 4/2004 | Kim et al. | |
| 6,744,276 B1 * | 6/2004 | Hauke et al. | ................... 326/30 |
| 6,815,980 B1 * | 11/2004 | Kerr | ............................. 326/30 |
| 6,856,178 B1 * | 2/2005 | Narayan | ...................... 327/108 |

OTHER PUBLICATIONS

A. Datta, Basics of Inverter: Analysis and Design; Jun. 4, 2002, slides 1-21.
AMCC Gigabit Ethernet Chipset Specification; Mar. 29, 2000, pp. 1-19.
IDT 3.3V CMOS 1-to-10 Clock Driver Specification; Jan. 2002, pp. 1-6.
K. Mustafa et al., DC-Coupling Between Differential LVPECL, LVDS, HSTL, and CM, Mar. 2003, pp. 1-15.
S. Badel et al., Fully Differential Current-Mode Logic Circuits and Interconnects for very High-speed system Design; 2003, p. 1, no month.
M. Karlsson et al., A Robust Differential Logic Style with NMOS Logic Nets; Date Unknown, pp. 1-4.

* cited by examiner

*Primary Examiner*—Don Le
(74) *Attorney, Agent, or Firm*—W. H. Lam

(57) ABSTRACT

A novel driver circuit that uses a differential driver as a design backbone is described. Unlike a conventional differential interface, which typically has two or more outputs for providing an output signal and its complement, one of the differential driver's outputs is coupled to drive an output signal onto a signal line, while another one of the differential driver's outputs is unused and terminated, for instance by coupling the output to package ground or a voltage source via a capacitor. The performance of the driver circuit is significantly improved over conventional singled-ended driver designs.

67 Claims, 23 Drawing Sheets

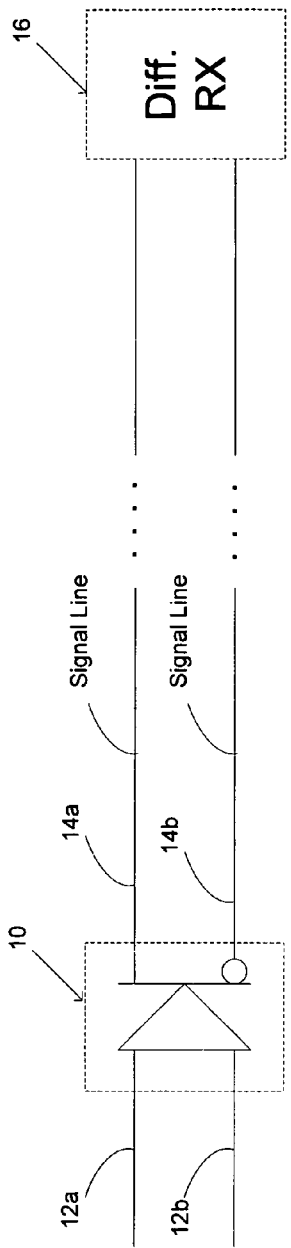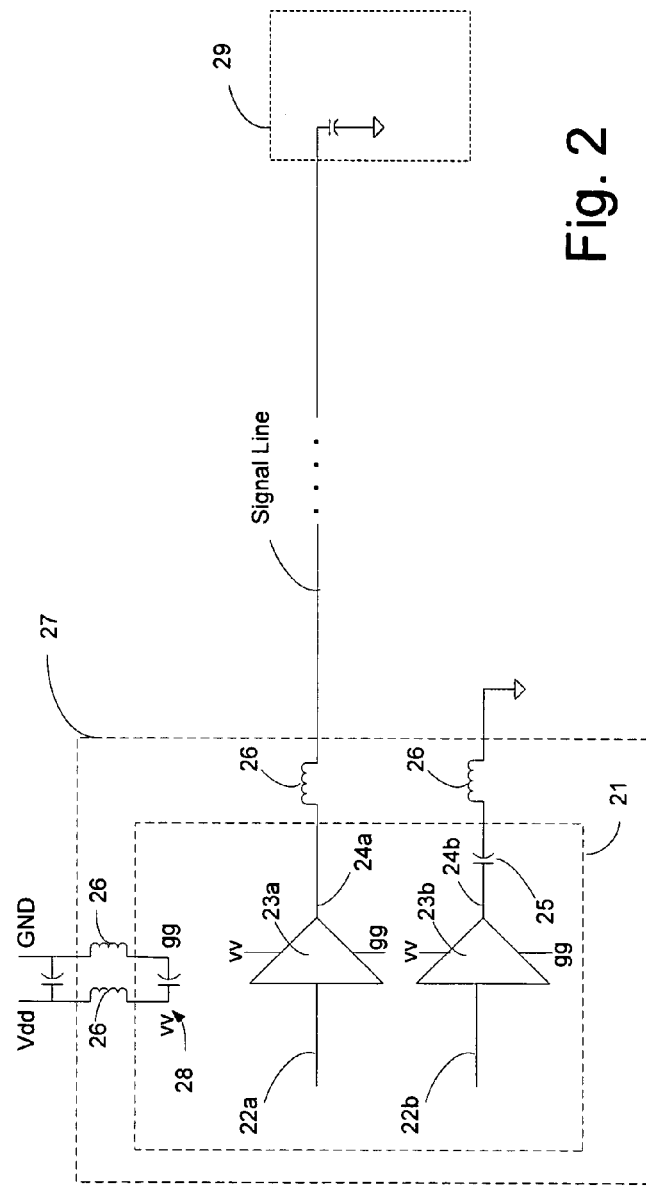

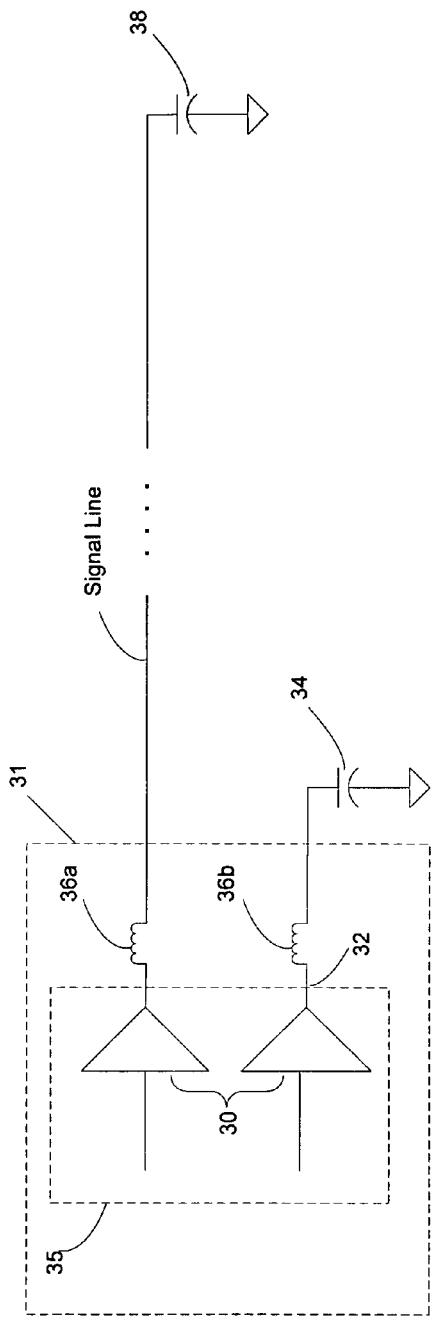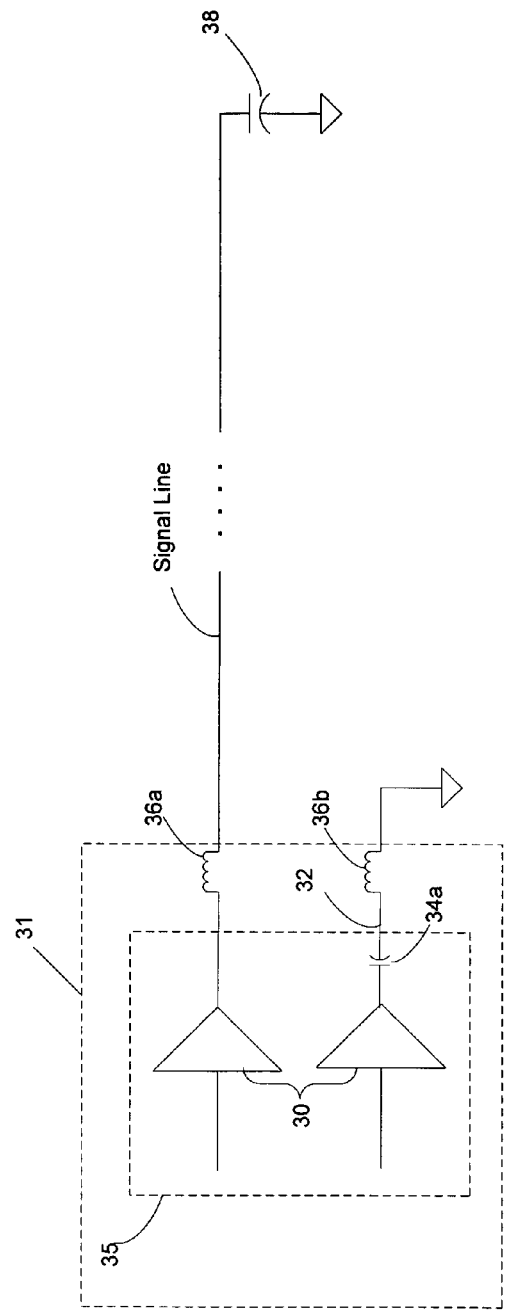

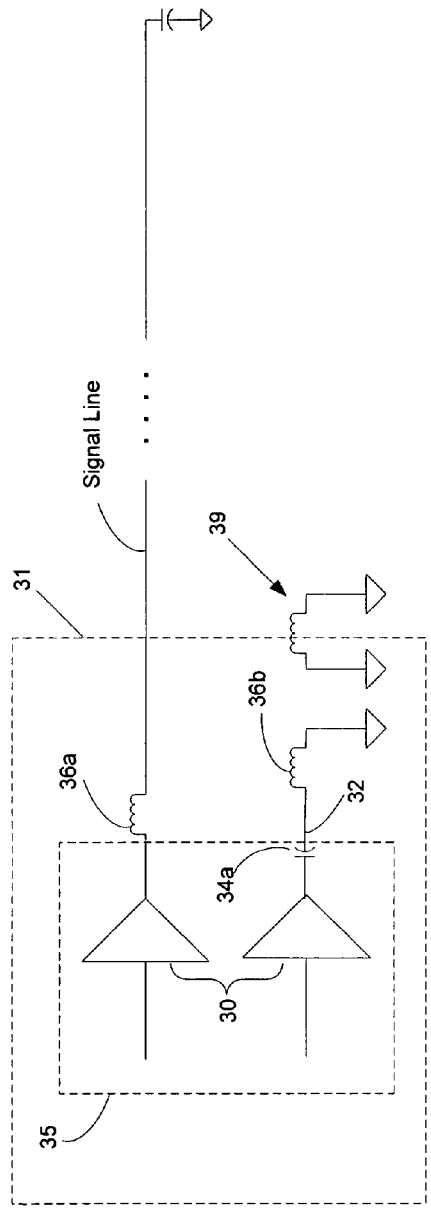
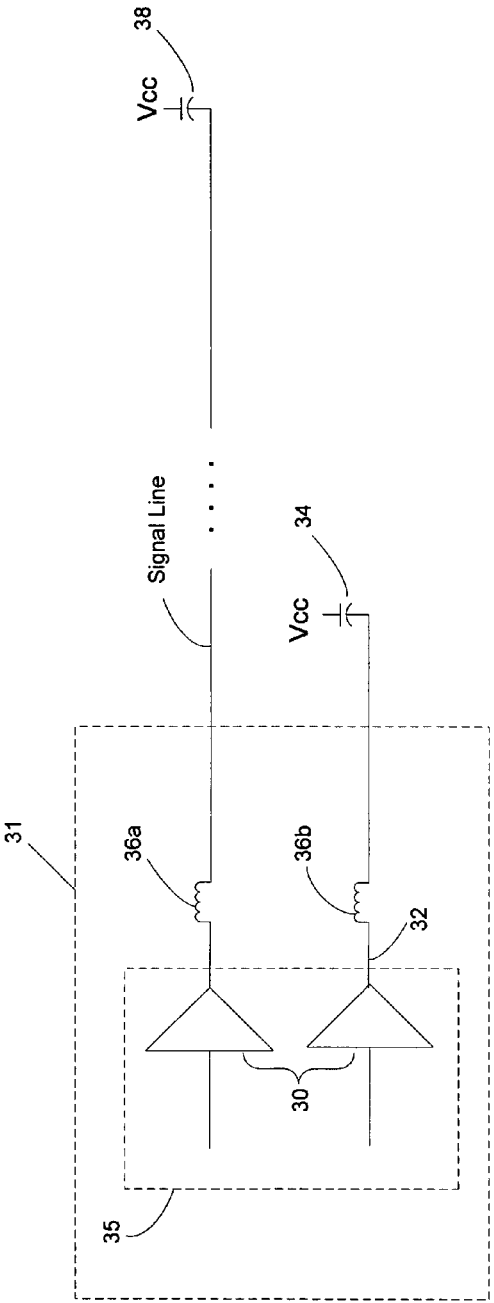

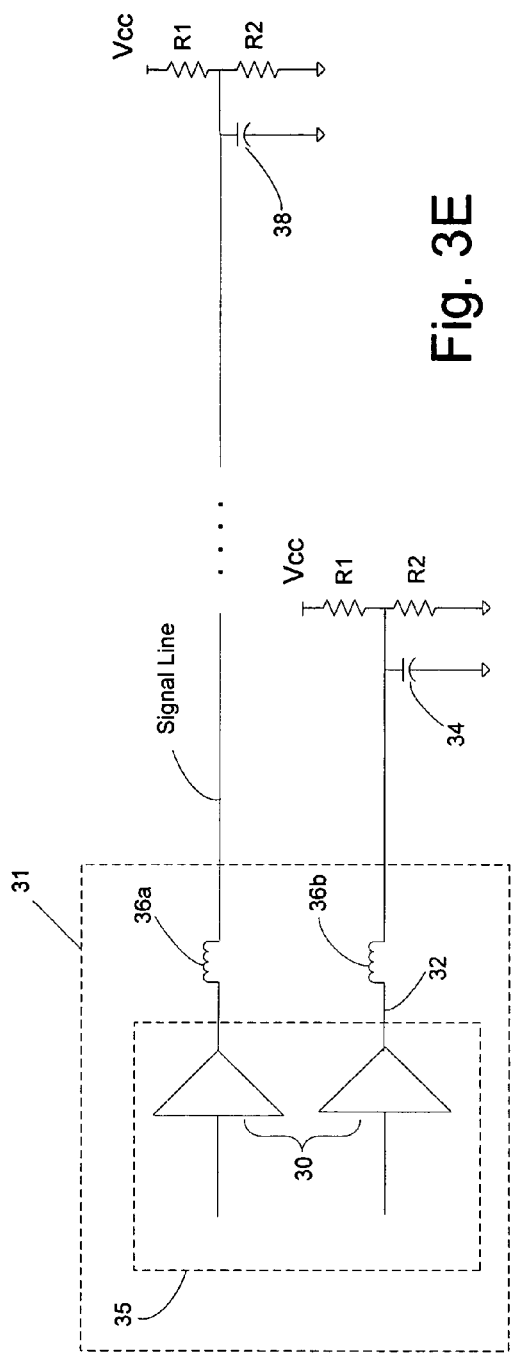

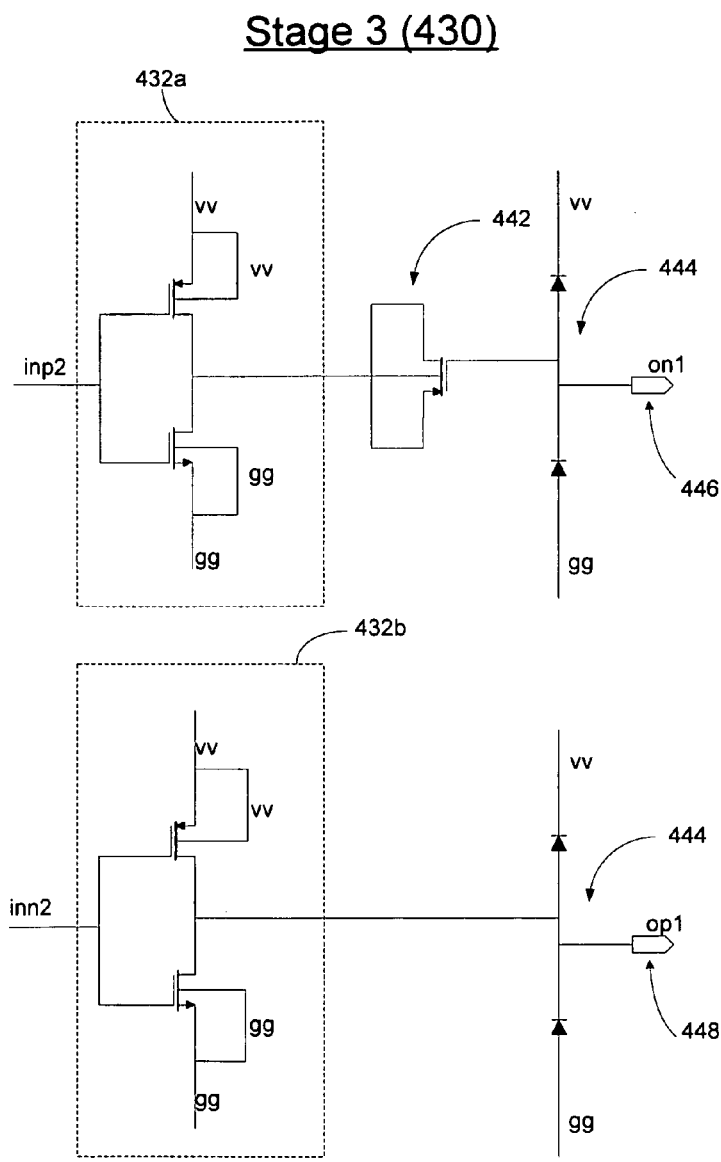
Fig. 4B
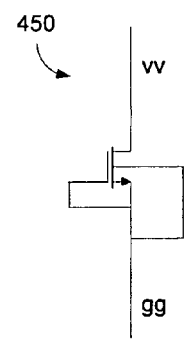
Fig. 4C
Fig. 4D

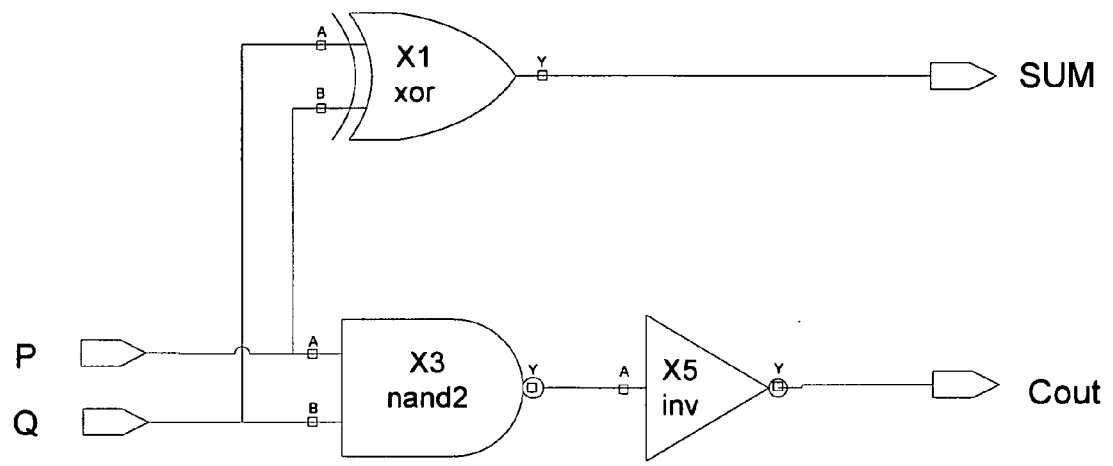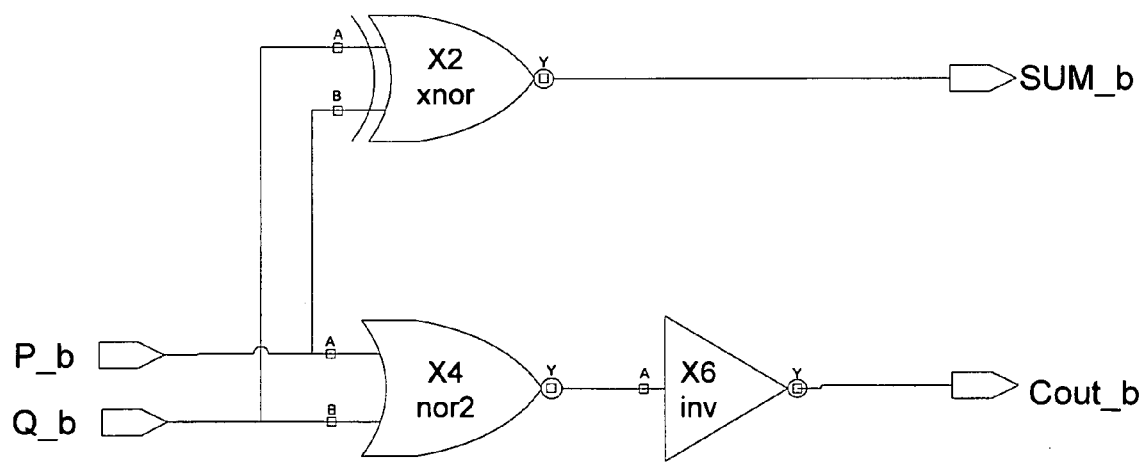
Fig. 16

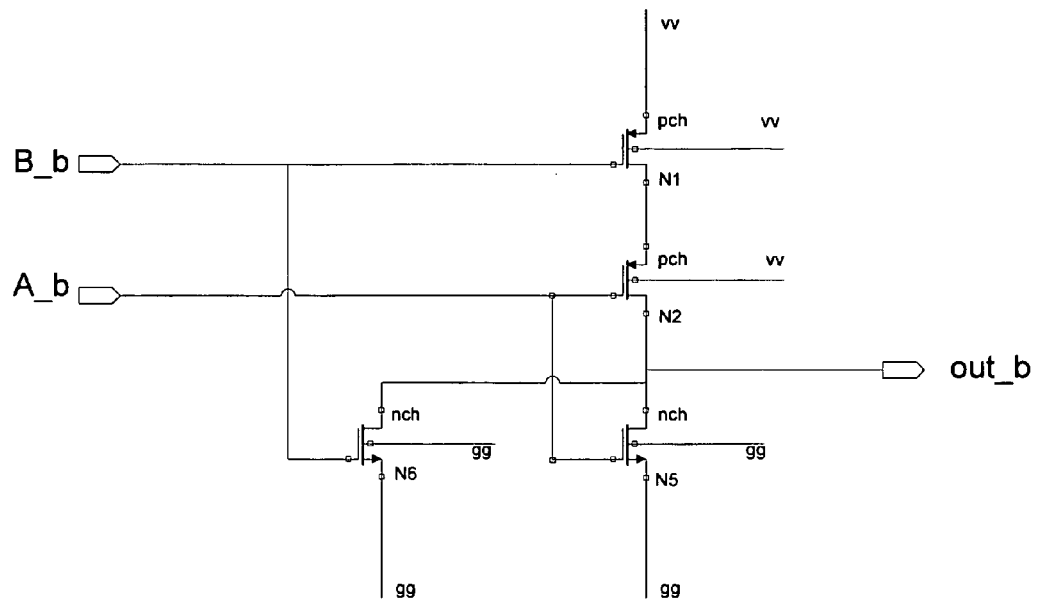
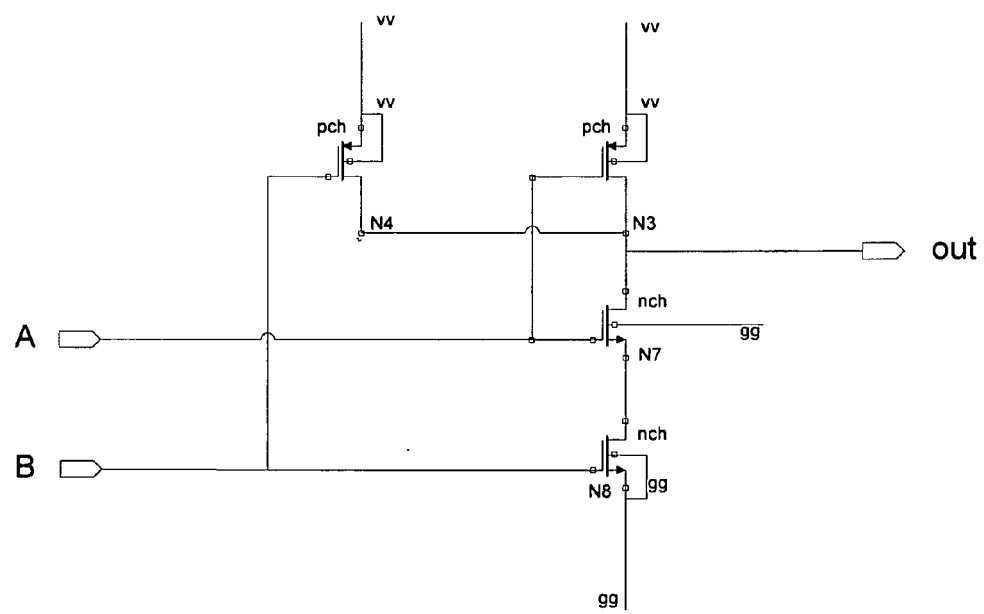
Fig.18

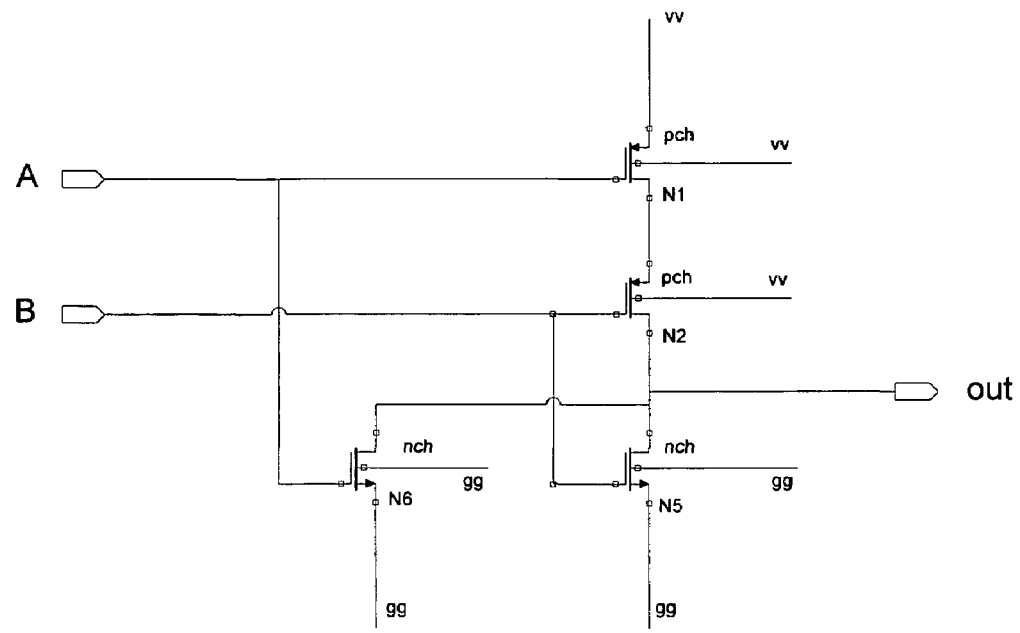
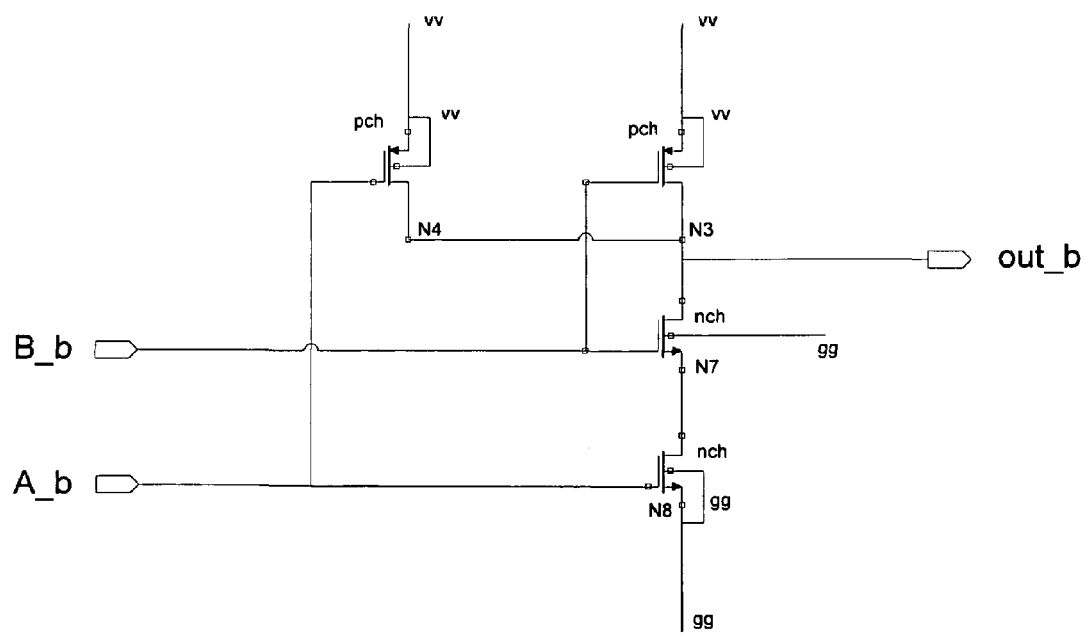
Fig.19

HIGH SPEED INTEGRATED CIRCUIT

FIELD OF THE INVENTION

The present invention relates generally to digital communication interface and more specifically to high speed circuit designs.

BACKGROUND OF THE INVENTION

A signal line is a conductor used to transmit electrical signals between various devices in an electronic system or between devices located in two separate electronic systems. Output driver circuits contained on each device are used to buffer signals originating from the device so that they may be driven onto the signal lines.

There are well known single-ended output driver circuits (e.g., TTL drivers) that are simple to use. However, many of these previously disclosed driver circuits are not suitable for high speed signals due to their low maximum operating frequency and high noise. For example, the maximum operating frequency of a single-ended CMOS driver circuit IDT74FCT3807D/E, which is available from Integrated Device Technology, Inc. of Santa Clara, Calif., is 166 Mhz.

For driving high speed signals, differential drivers are often used. A typical differential driver 10 is schematically illustrated in FIG. 1. The differential driver 10 includes data inputs 12a–12b for inputting a differential data signal, and data outputs 14a–14b for providing the differential signal to a differential receiver 16 via signal lines. The arrangement of FIG. 1 is well known to have high operating frequency. However, differential interface designs have disadvantages as well. First, every differential signal requires two or more signal lines. Therefore, a differential I/O interface will require at least twice the number of pins than a single-ended I/O interface, resulting in a larger chip. Furthermore, high speed systems generally require careful matching of the electrical length of the signal lines such that synchronous signals may be received with a common clock and a common phase. This design requirement is sometimes known as "length matching" or "delay matching." A wide differential interface will require a large number of signal lines, necessarily complicating the length matching effort and increasing the cost of manufacture. In some instances, length matching many signal lines may be impossible on tightly packed circuit boards. Thus, at least in some electronic systems, it is not desirable to use differential interfaces.

Accordingly, a single-ended output interface design that communicates single-ended signals at a performance level that is comparable to that of a differential interface may be desirable.

SUMMARY OF THE INVENTION

An embodiment of the invention is a single-ended output interface that uses a differential driver as a design backbone. Unlike a conventional differential interface, which typically has two or more outputs for providing an output signal and its complement, the differential driver of the present embodiment has one of its outputs coupled to drive a signal onto a signal line, while a complementary output is not used for signal transmission. Rather, the complementary output is considered logically redundant and is terminated, for example, by coupling to package ground or system ground via a capacitor. A result of terminating a logically redundant output is that the performance of the output interface may be significantly improved over conventional designs.

In one embodiment of the invention, multiple differential drivers are implemented within an integrated circuit that has a package ground plane. According to this embodiment, each "unused" output of differential drivers may be terminated at the package ground plane through a capacitor. The package ground plane itself may be coupled to one or more GND pins. In this way, very few pins are needed by the "unused" outputs. Furthermore, only one signal line is needed for each single-ended output signal. In comparison to conventional differential interfaces, where two pins and two signal lines are required for each differential signal, the number of pins and signal lines used by the present embodiment may be significantly smaller.

Another embodiment of the invention is an integrated circuit having a single-ended input and multiple single-ended outputs, for instance a clock driver. Within the integrated circuit, the input signal is first converted into a differential signal. The differential signal is distributed to the multiple differential drivers. Each differential driver may have an output for providing a single-ended output signal and an "unused" output, which terminates one component of the differential signal. Each "unused" output may be coupled to package ground or system ground via a capacitor for the purpose of improving the performance of the other output.

Another embodiment of the invention is an integrated circuit having single-ended inputs and single-ended outputs. The single-ended outputs are implemented using differential drivers each having one output that is "unused." Within the integrated circuit, differential signals may be originated, processed and distributed to the multiple differential output driver circuits. Each differential driver may have an output for providing a single-ended output signal and an "unused" output. The "unused" output of each differential driver may be coupled to package ground or system ground via a capacitor for the purpose of improving the performance of the other output. Circuits that process differential signals within the integrated circuits may be implemented with differential standard cells in accordance with some embodiments of the invention.

Yet another embodiment of the invention is an integrated circuit having a logic core and a plurality of output pads or I/O pads coupled to the logic core. The output pads or I/O pads may include circuits for receiving single-ended signals from the logic core, converting the single-ended signals into differential signals, and providing one component of each differential signal as a single-ended output signal. Another component of each differential signal is terminated, for example, by coupling to package ground or system ground via a capacitor.

BRIEF DESCRIPTION OF THE DRAWINGS

The invention will now be described with reference to the accompanying drawings which illustrate various example embodiments of the invention. Throughout the description, similar reference names may be used to identify similar elements.

FIG. 1 depicts a differential driver.

FIG. 2 depicts an output driver circuit that uses a differential driver as a backbone according to an embodiment of the invention.

FIGS. 3A–3F depict examples of various embodiments of the invention.

FIGS. 4A–4D depict an example implementation of a circuit in accordance with an embodiment of the invention.

FIG. 16 depicts an example half-adder circuit implemented according to an embodiment of the invention.

FIG. 18 is a diagram depicting an example gate-level implementation a differential NAND gate of FIG. 12A.

FIG. 19 is a diagram depicting an example gate-level implementation a differential NOR gate of FIG. 12B.

DETAILED DESCRIPTION OF PREFERRED EMBODIMENTS

Figure 4A:
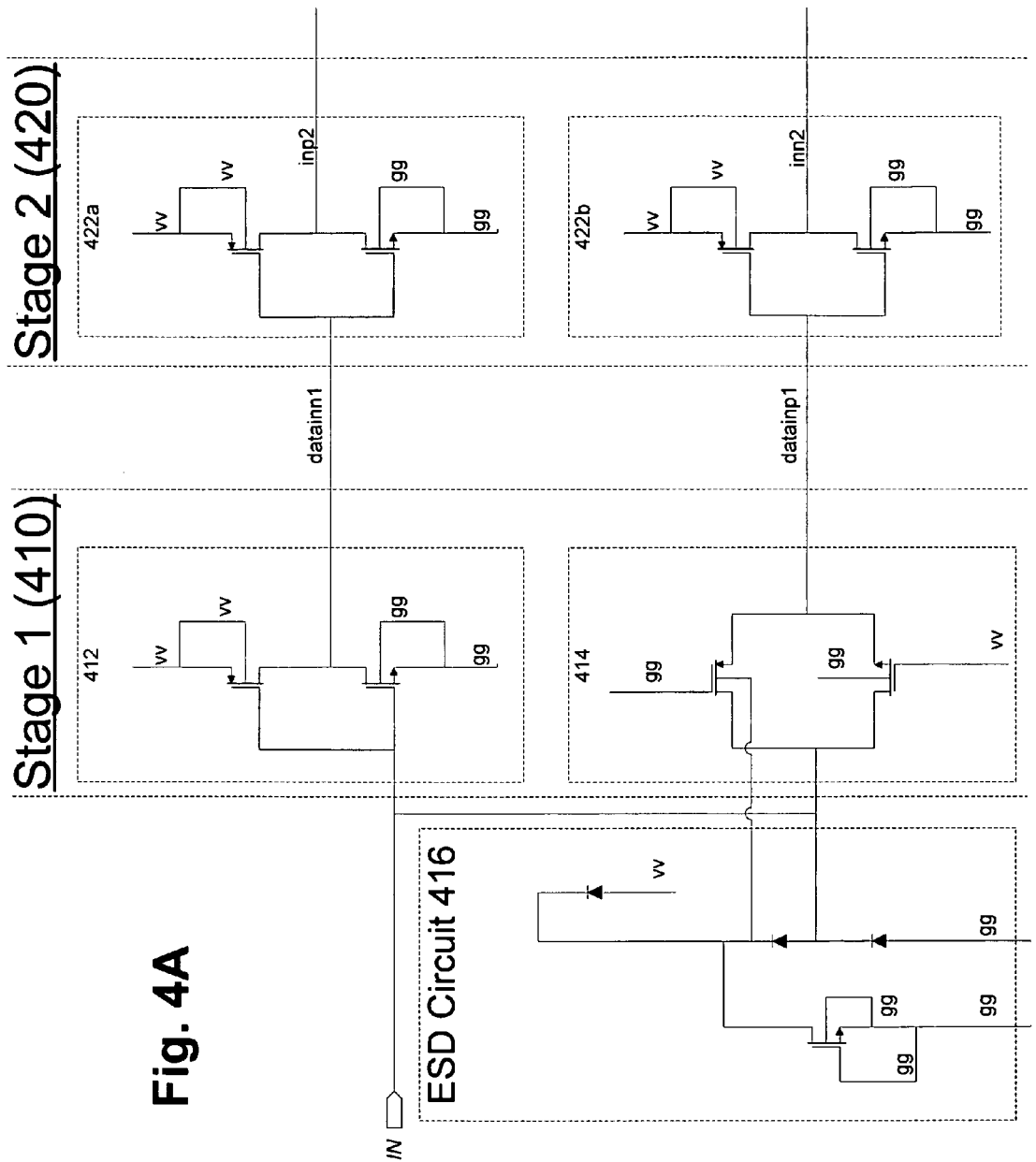

Various features of the invention, including specific implementations thereof, will now be described. Throughout the description, the term "differential signal" refers to a signal that is carried by more than one signal lines, and thus a differential signal includes two or more component signals that may be complementary to each other. If the sum of two time-varying signals always approximately equals a constant value, such as zero, the signals are said to be "complementary" to each other. The term "single-ended signal" refers to a signal that is carried by a single signal line. Furthermore, the terms "driver" and "driver circuit" are used synonymously.

Throughout the description, the term "unused output" refers to an output of a differential output driver that is not used to provide a signal to a receiver, or one that is not used to drive a signal line. The term "unused output" may also refer to an output of a differential output driver that may be coupled to package ground, system ground, voltage source, etc., via a capacitor. Additionally, the term "unused output" may refer to an output of a differential output driver that drives a component of a differential signal to package ground, system ground, voltage source, etc., via a capacitor. An "unused signal" herein may refer to a signal that is provided by an unused output and that is not provided to a signal receiver. A more specific meaning for the above terms may be inferred by context.

Furthermore, the terms "couple" and "coupled" may describe a direct or an indirect connection. For example, a node may be connected to one end of a capacitor, and another end of the capacitor may be connected to system ground. The node is said to be "coupled" to system ground even though the connection is an indirect one.

The various features of the invention set forth herein may be embodied within a wide range of integrated circuits including, but not limited to, signal drivers, clock drivers, oscillators (e.g., ring oscillators, crystal oscillators), serial bus drivers, ethernet drivers, optical transmitters, memory bus drivers, ethernet drivers, optical transmitters, memory controllers, memories, microprocessors, wireless transmitters, and power amplifiers, some of which may be found in computer systems and wireless devices (e.g., laptop computers, wireless telephones and personal digital assistants). Also, it should be understood that some implementations described herein may be specific to CMOS technology and that features of the invention may be applicable to other integrated circuit technologies as well.

Referring to FIG. 2, there is schematically illustrated an output driver circuit in accordance with an embodiment of the invention. The output driver circuit includes inputs 22a–22b for receiving a differential signal, and drivers 23a–23b for providing the differential signal through outputs 24a–24b. According to an embodiment of the invention, the differential signal includes two complementary signal comparators. Note that driver 23a drives one of the complementary signals as a single-ended output signal to receiver 29 via a signal line. The other one of the complementary signals is unused and is terminated, for instance by coupling the output 24b to system ground (GND) via a capacitor 25. As a result of terminating the unused signal, which is considered logically redundant to and inverse of the "used" signal, the performance of the output driver circuit may be significantly better than those of conventional single-ended driver designs.

In a preferred embodiment, the driver 23a and driver 23b are connected to the same voltage source and the same ground. In one embodiment of the invention, the circuit in FIG. 2 may be implemented using TTL-CMOS, which may minimize static current requirement and provide high power output. For example, a TTL-CMOS circuit according to the invention may have a static current that is close to zero (e.g., 0.1 μA) and may have a power output of 3 V or more. A power output of 3 V or more is significantly higher than the power output of an LVDS (Low Voltage Differential Signaling) differential driver, which is typically about 350 mV. Thus, the invention may allow one to achieve high frequency without compromising performance for low static current and high output power.

Also depicted in FIG. 2 are die 21, package 27, and inductors 26 representative of the inductance associated with the bonding wires of the package 27. Also shown in FIG. 2 is a decoupling capacitor 28. The decoupling capacitor 28 may be located on the die 21, outside the die 21 but inside the package 27, or outside the package 27.

According to one embodiment of the invention, the unused output of the driver 23b may be terminated inside or outside the package, and the capacitor 25 may be placed inside the die 21, outside the die 21 but within the package 27, or outside the package 27. Furthermore, the capacitor 25 may be coupled to a voltage source, such as Vcc, or any pre-determined voltage.

FIGS. 3A–3F depict several ways of terminating the unused output. In light of the disclosure herein, one of ordinary skill in the art would appreciate that many other ways of terminating unused outputs are within the scope of the principles of the invention disclosed herein. For instance, in embodiments where a capacitor is illustrated, one of ordinary skill in the art would appreciate that an inductor and/or resistor may be used in combination with or in lieu of the capacitor, depending on the application and loading. Many other combinations and permutations of resistance, capacitance and inductance values and their locations are possible.

FIG. 3A schematically depicts an output driver circuit according to an embodiment of the invention. The output driver circuit includes a differential driver 30 that is configured to receive a differential signal. Unlike outputs of conventional differential drivers, one output of the different driver 30 provides a single-ended output signal to a signal line, and another output 32 is unused and is terminated. As shown in FIG. 3A, a capacitor 34 couples the unused output 32 to GND. In one embodiment, the capacitor 34 may have the same capacitance as the load, which is represented by capacitor 38 and which is typically a signal I/O receiver. In one implementation, the capacitance of capacitor 34 may be approximately half-way between the maximum loading capacitance and minimum loading capacitance of the integrated circuit, and the capacitance may vary depending on application. In another implementation where the output load capacitor 38 has a maximum value of about 15 pf, the capacitance of the capacitor 34 is preferably between approximately 5 pf to approximately 13 pf. In the embodiment shown in FIG. 3A, the capacitor 34 is implemented outside the die 35 and the chip package 31, for instance on a printed circuit board (PCB). Also as shown in FIG. 3A are inductors 36a–36b, which represent the inductance within the package 31.

FIG. 3B schematically depicts a differential driver 30 whose unused output 32 is terminated outside the package 31 via a capacitor 34a and an inductor 36b. Note that in this embodiment the capacitor 34a is located on the same die 35 as the differential driver 30. As in the embodiment shown in FIG. 3A, the capacitor 34a may have the same capacitance as the load. In one implementation, its capacitance may be approximately 5–13 pf. Note that this capacitance may vary depending on the application.

FIG. 3C schematically depicts a differential driver 30 whose unused output 32 is terminated inside the package 31, in accordance with an embodiment of the invention. In this embodiment, the unused output 32 is terminated at a ground plane of the package 31. The ground plane is in turn coupled to an external ground (e.g., system ground) via a connector or pin 39.

FIG. 3D schematically depicts another embodiment of the invention. In this embodiment, the unused output 32 of the differential driver 30 is coupled to an external voltage source Vcc via a capacitor 34. Note that in this embodiment, the load is coupled to Vcc as well.

FIG. 3F schematically depicts yet another embodiment of the invention. In this embodiment, the unused output 32 of the differential driver 30 is terminated at a pre-determined voltage via a capacitor 34. Note that in this embodiment, the load is coupled to the same pre-determined voltage as well.

FIG. 3F schematically depicts yet another embodiment of the invention. In this embodiment, capacitor 34a and resistor 37 are located on die 35. Preferably the resistor 37 may have approximately the same resistance as the series resistor R on the signal line. The series resistor R may be implemented to suppress the reflection signal on the signal line.

It should be noted that the output driver circuits and the receivers may not necessarily be implemented within the same system. In other words, the signal lines connecting the output driver circuits and the receivers are not limited to signal traces of a printed circuit board (PCB). The output driver circuits according to the present invention may be used to drive signals across cables (e.g., CAT-6 cables) or other types of electrical connections. According to one embodiment, the output driver circuit may drive signals that have a large voltage swing. Thus, the signals may be carried for a large distance. Furthermore, in some embodiments, the signal lines may not be strictly electrical connections. Rather, a signal line may be any signal path, which may include electrical connections, optical connections, wireless connections, and/or any other type of conduits, and/or any combination thereof.

Referring now to FIGS. 4A–4D, there is shown schematically an example implementation of a circuit according to an embodiment of the invention. In FIGS. 4A–4D and other drawings, "gg" indicates chip ground, and "vv" indicates chip voltage Vdd. This illustrated implementation may be sub-divided generally into three stages. The first stage 410, which includes inverter 412 and transmission gate 414, converts the input signal into a differential signal. Naturally, the inverter 412 causes a small signal propagation delay. A function of the transmission gate 414 is to provide sufficient delay such that the resulting differential signal has complementary components. In an alternate embodiment, the transmission gate 414 may be replaced by an appropriate RC circuit. In that embodiment, the RC circuit may have RC characteristics that generally match those of the inverter 412.

Figure 13:
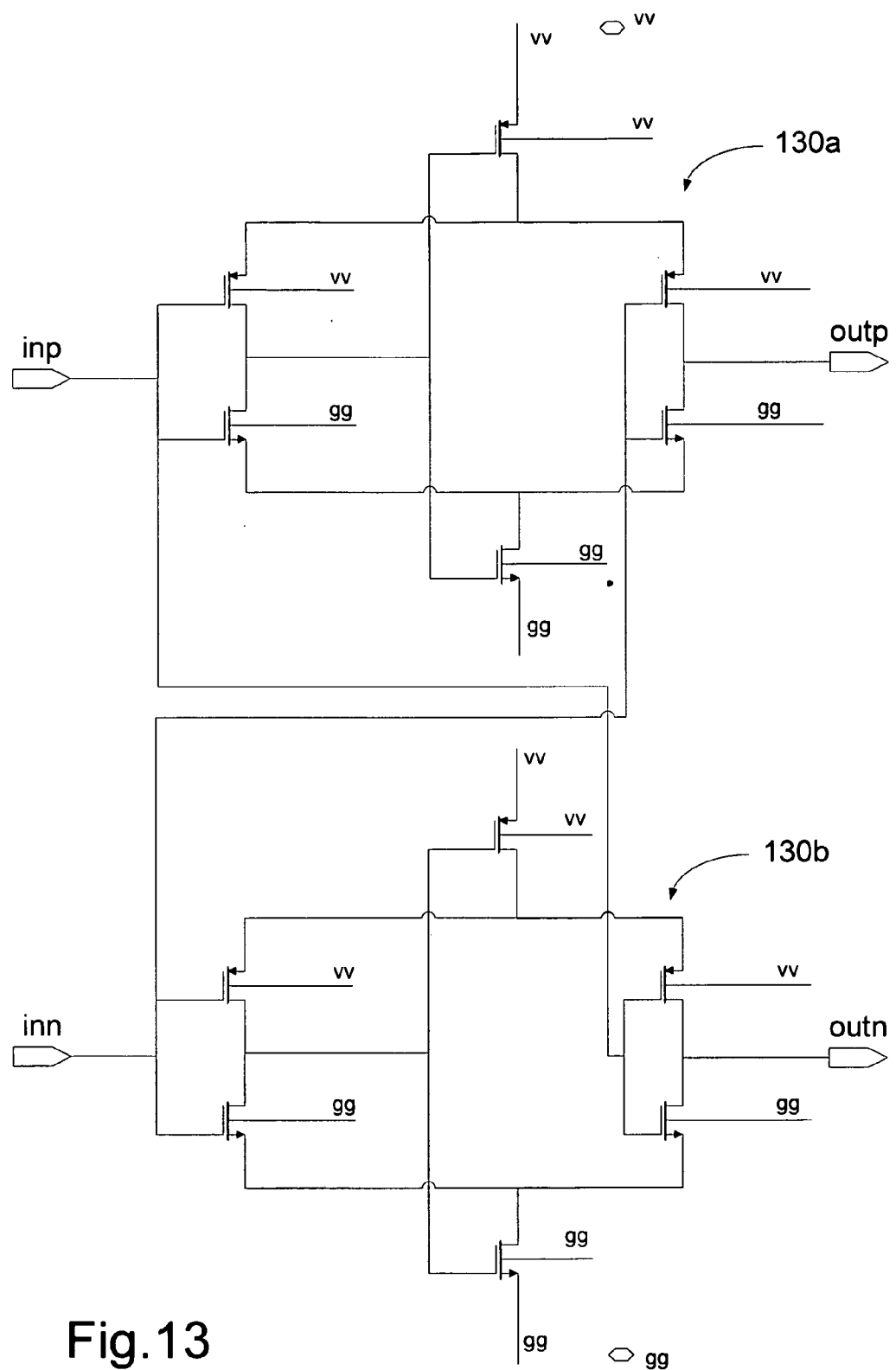
FIG. 13 depicts two comparator circuits that may be used in another example implementation of an output driver circuit in accordance with an embodiment of the invention.

With reference still to FIG. 4A, the first stage 410 may be coupled to an electrostatic discharge (ESD) circuit 416 that protects the input circuit from electrostatic discharge. Also note that in this variation the ESD circuit 416 utilizes the transmission gate 414 to provide the ESD protection function. The ESD circuit 416 further provides a 5V I/O tolerant function when the overall circuit is driven by 3 V to 3.6 V. Furthermore, the first stage 410 may include a comparator, an example of which is shown in FIG. 13 (described further below), for receiving differential signals.

The second stage 420 includes two inverter circuits 422a–422b coupled to inverter 412 and transmission gate 414, respectively, to receive the differential signal. Note that the second stage 420 is optional. In another embodiment of the invention, outputs of the first stage 410 may connect directly to inputs of the third stage 430. In other embodiments, the second stage 420 may include any logic circuit. For instance, the second stage 420 may include latches, flip-flops, etc. in place of the inverter circuits 422a–422b.

According to an embodiment of the invention, the second stage 420 may include circuits capable of processing differential or complementary signals. These circuits may be implemented with a plurality of differential standard cells that have differential inputs and differential outputs. Examples of some differential standard cells of the invention are illustrated in FIGS. 12A–12G, which are described further below.

It should be appreciated by one skilled in the art having the benefit of the present disclosure that the differential standard cells of the invention are different from previously disclosed differential circuits such as differential current mode logic. For instance, current mode logic circuits have static currents (and current sources), and thus they are not suitable for VLSI implementation. In contrast, circuits built according to the differential standard cells of the invention may not have static currents (except for leakage current), and thus they are suitable for VLSI implementation. It should also be appreciated by one skilled in the art having the benefit of the present disclosure that the differential standard cells shown in FIGS. 12A–12G and FIG. 13 (described below) do not represent an exhaustive list, and that many other differential standard cell designs consistent with the principles of the invention are possible. Since the differential standard cells are not using current source, the term "voltage mode" is used herein to describe the differential standard cells and to distinguish them from current mode logic.

The third stage 430, which is shown in FIG. 4B, may include multiple inverter circuits although only two inverter circuits 432a–432b are illustrated. In this embodiment, the inverter circuits 432a–432b are coupled to the inverter circuits 422a–422b (FIG. 4A), respectively. In other embodiments, the connections may be swapped. That is, the inverter circuits 432a may be coupled to inverter circuit 422b, and inverter circuit 432b may be coupled to inverter circuit 422a.

The third stage 430 further includes transistors 442, which acts as a capacitor, and ESD Diodes 444. According to an embodiment of the invention, the inverter circuit 432a provides the "unused output" of the differential driver of FIGS. 4A–4B. According to one embodiment of the invention, the output 446 is coupled to ground plane of an integrated circuit package such that the output 446 may be coupled to GND when the integrated circuit is in operation. The output 448 may be coupled to an output pin of the integrated circuit such that the output 448 may drive a signal line when the integrated circuit is in operation.

FIG. 4C depicts a decoupling capacitor 440, and FIG. 4D depicts an ESD protection circuit 450. Both the decoupling capacitor 440 and the ESD protection circuit 450 may be part of the same integrated circuit as the output driver circuits. The decoupling capacitor 440 is for providing a clean voltage source and ground within the die, and the ESD protection circuit 450 is for protecting the circuits from electrostatic damage. Other circuitry may be implemented as part of the integrated circuit as well. The capacitance of the decoupling capacitor 440 can be very small or very large and may vary from one implementation to another as long as it is capable of providing a clean voltage source and ground within the die.

According to an embodiment of the invention, the circuits of FIGS. 4A–4D are implemented using CMOS technology. PMOS transistors shown in FIGS. 4A–4B have the following device parameters: m=4, w=80 μm, L=0.35 μm (except PMOS transistors 442). NMOS transistors shown in FIGS. 4A–4B have the following device parameters: m=4, w=40 μm, L=0.35 μm. PMOS transistor 442 has the following device parameters: m=3, w=46.5 μm, L=12.9 μm. The NMOS transistor 440 (FIG. 4C) has the following device parameters: m=3000, w=30 μm, L=20 μm. The NMOS transistor 450 (FIG. 4D) has the following device parameters: m=8, w=40 μm, L=0.35 μm. These implementation details are provided for completeness purposes only and such details should not be construed to limit the scope of the invention. Embodiments of the present invention may be implemented in many other ways using different technologies, different types of transistors and different device parameters.

Referring now to FIG. 13, there is shown a differential comparator 130 that may be used as an alternative to circuits 412 and 414 of FIG. 4A. The circuits 412 and 414 are configured to receive a single-ended input signal and to convert the single-ended input signal into a differential signal. Unlike circuits 412 and 414, the differential comparator 130, which includes comparator circuits 130a–130b, is configured to receive a differential signal and provide the comparison result and its complement (or inverse) or other circuits, for instance circuits 422a and 422b. According to an embodiment of the invention, the differential comparator circuit 130 may be used for receiving differential signals originated from another portion of the integrated circuit or outside of the integrated circuit. The differential comparator circuit 130 may be used also for receiving LVDS, LVPECL, HSTL and other differential signals that have a small voltage swing. In some embodiments where the differential signals have large voltage swings, the differential signals may be fed directly to circuits of the second stage 420 or the third stage 430.

Figure 5:
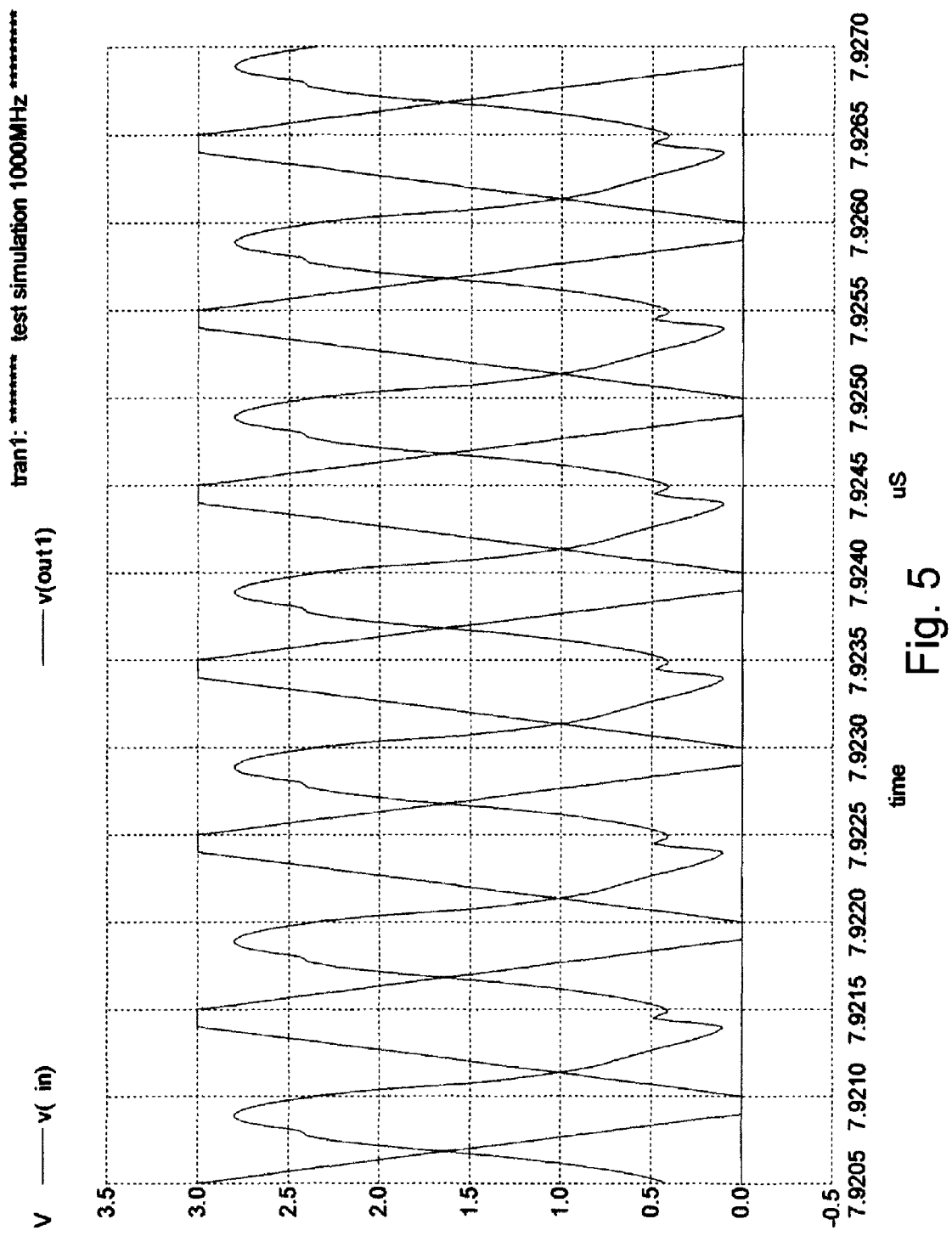
FIG. 5 depicts simulation results of the output interface design of FIGS. 4A–4B.

Attention now turns to FIG. 5, which depicts simulation results of the output driver circuit design of FIGS. 4A–4D. The simulation results are obtained by using TSMC 0.35 μm BSIM-3 spice model. The output frequency of approximately 1 Ghz is achievable with a 5 pf load.

Figure 6:
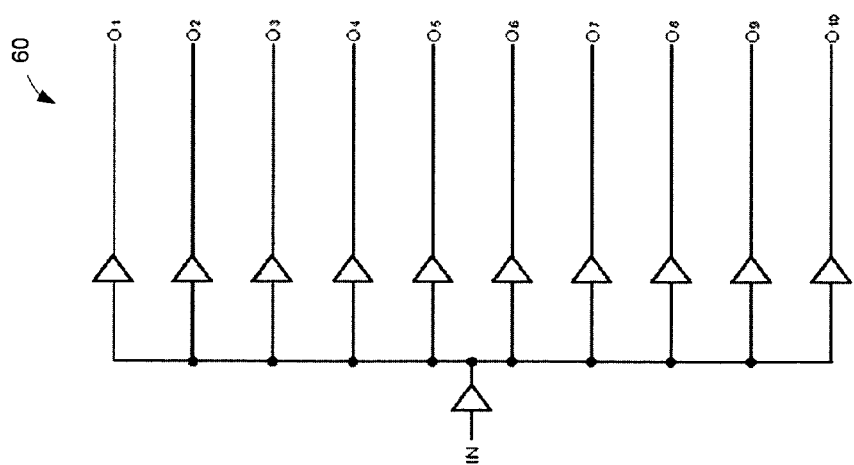
FIG. 6 depicts a schematic of a known clock driver circuit.

Referring now to FIG. 6, there is shown a schematic of a known CMOS clock driver integrated circuit 60, an example of which is an integrated circuit bearing model number IDT74FCT3807D/E, which is available from Integrated Device Technology, Inc. of Santa Clara, Calif. As shown, this clock driver circuit has an input for receiving a clock signal, and ten outputs for distributing the clock signal to ten devices. A maximum operating frequency of the clock driver circuit is 166 Mhz. In many applications, an operating frequency higher than 166 Mhz is often desired.

Figure 7:
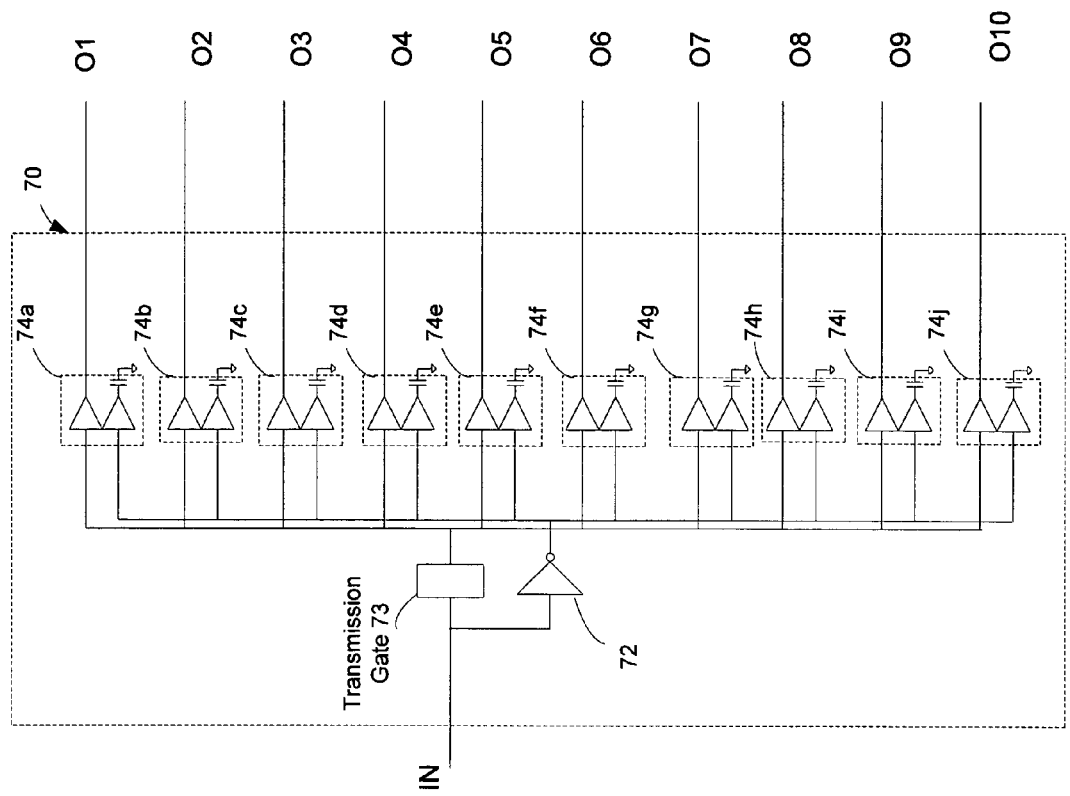
FIG. 7 depicts a schematic of a clock driver circuit according to an embodiment of the invention.

FIG. 7 depicts a schematic of a clock driver integrated circuit 70 according to an embodiment of the invention. As shown the clock driver circuit includes an input inverter 72 and a transmission gate 73 for receiving an input signal, and output drivers 74a–74j for providing multiple output signals. Note that, although the input signal and the output signals are single-ended signals, differential signals are communicated within the integrated circuit to the output drivers 74a–74j. As shown in FIG. 7, the input inverter 72 and the transmission gate 73 convert the input signal into differential signal and provide the differential signal to the output drivers 74a–74j. Furthermore, output drivers 74a–74j each have an unused output such that one component of each output differential signal is not transmitted. According to the present embodiment, the clock driver integrated circuit may achieve an operating frequency of 1 Ghz by using a 0.35 μm CMOS process technology. This performance level is significantly higher than the maximum performance level of the conventional CMOS clock driver shown in FIG. 6. In light of the disclosure herein, one of ordinary skill in the art would appreciate that the circuit shown in FIG. 7 may be implemented with other semiconductor technologies, such as 0.25, 0.18, 0.09 μm processes and/or GaAs, BiCMOS, an BJT processes, which may further enhance the frequency performance of the circuit.

In one embodiment of the invention, multiple differential drivers are implemented within in an integrated circuit. In this embodiment, the unused output of each differential driver may be coupled to an external ground (e.g., system ground) via individual GND pins. However, in some applications having an individual GND pin for each output driver circuit may be undesirable because the increased number of pins may increase the size and cost of the integrated circuit.

In another embodiment of the invention, multiple unused outputs may be coupled together to a package ground plane of the integrated circuit. The package ground plane is coupled to one or more GND pins, which are designated to be coupled to an external ground (e.g., system ground). In other words, one or more GND pins may be shared by all the unused outputs of the output driver circuits. In this way, a single GND pin may support a wide output interface.

Figure 8:
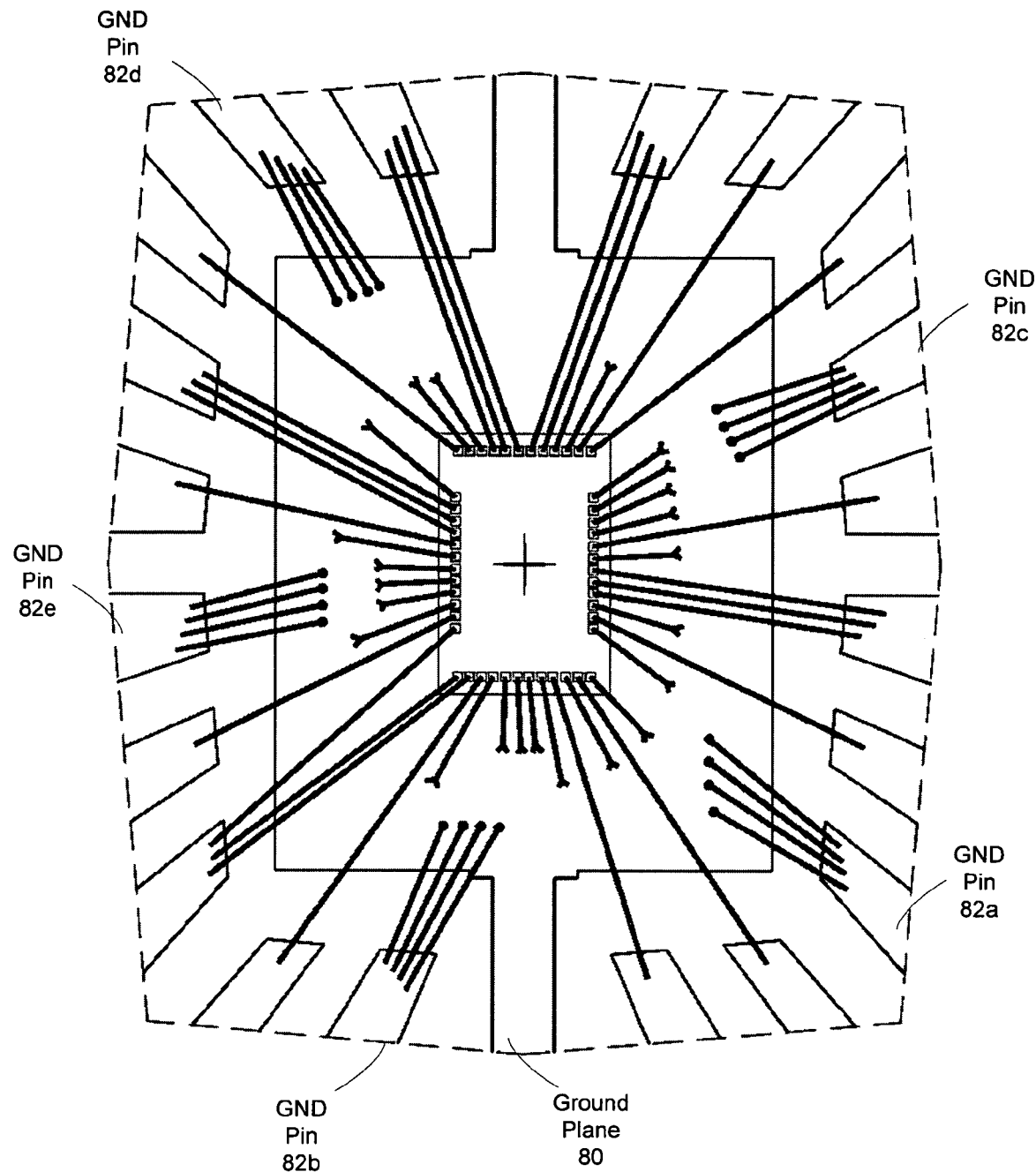
FIG. 8 depicts an integrated circuit package where unused outputs of the differential drivers are coupled to the common ground plane, in accordance with an embodiment of the invention.

An integrated circuit package 84 where unused outputs of the output driver circuits are coupled to a package ground plane is depicted in FIG. 8. As illustrated, multiple bond wires connect the bond pads that correspond to the unused outputs of the output driver circuits to the Ground Plane 80, which is itself connected to GNP Pins 82a–82e via other bond wires. Note that GND Pins 82a–82e are not designated for signal transmission purposes but are designated to be coupled to ground.

In another embodiment of the invention, unused outputs of the output driver circuits may be coupled together to a common node within the die or within the chip package. The common node may be coupled to a ground node, a voltage source, or a node with a pre-determined voltage so as to terminate the unused signals.

Figure 9A:
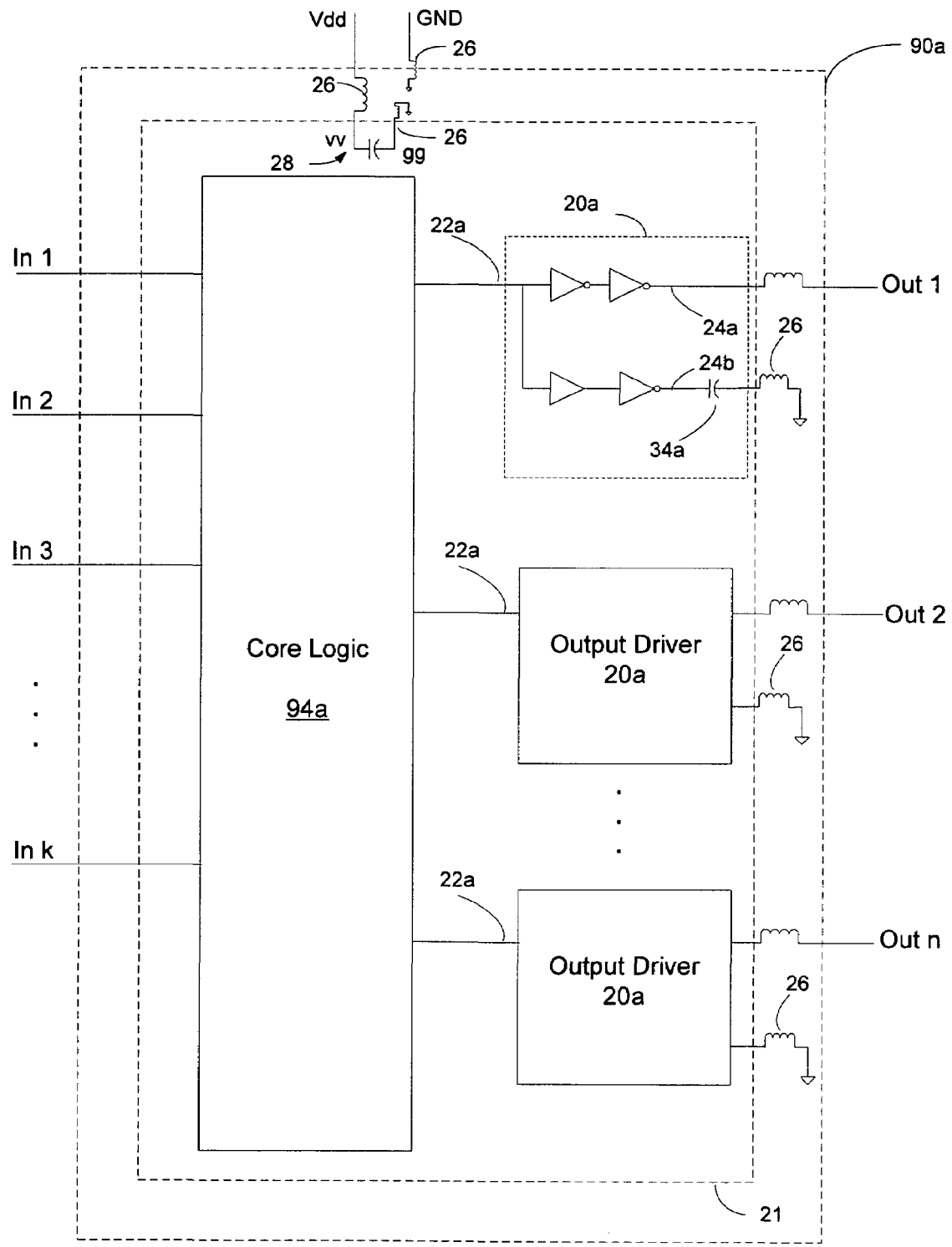
FIG. 9A-9D depict integrated circuits according to embodiments of the invention.

Attention now turns to FIG. 9A, which depicts schematically an integrated circuit 90a according to an embodiment of the invention. The integrated circuit 90a includes core logic 94a, which may include, for instance, CMOS logic circuits such as a central processing unit (CPU) core, and/or a memory core (e.g., a DRAM core). The integrated circuit 90a further includes output drivers (or "output pads") 20a for providing output signals.

According to the embodiment shown in FIG. 9A, an output driver 20a receives a single-ended signal from the core logic 94a via input 22a. The output driver 20a, which may include circuits shown in FIGS. 4A–4B, converts the single-ended signal into a differential signal, provides one of the component of the differential signal as an output signal via output 24a, and terminates the other component signal via output 24b and capacitor 34a.

According to an embodiment, the output 24a may be coupled to a signal pin designated to provide an output signal, whereas the output 24b may be coupled to a GND pin that is designated to be coupled to system ground. In another embodiment, the output 24b may be coupled to a package ground plane, which is in turn coupled to a GND pin that is designated to be coupled to system ground. In other embodiments, the output 24b may be terminated using other techniques.

Preferably, the output drivers 20a share the same chip voltage "vv" and the same chip ground "gg". However, it should be understood that in other variations the output drivers 20a may or may not share the same chip voltage "vv" or the same chip ground "gg". For instance, one of the output drivers may be coupled to a first chip voltage vv1 and a first chip ground gg1, while another one of the output drivers may be coupled to a second chip voltage vv2 and the chip ground gg1. Furthermore, one of the output drivers may be coupled to a second chip voltage vv2 and a second chip ground gg2. Many other variations may be apparent to those of ordinary skill in the art having the benefit of this disclosure.

Figure 9B:
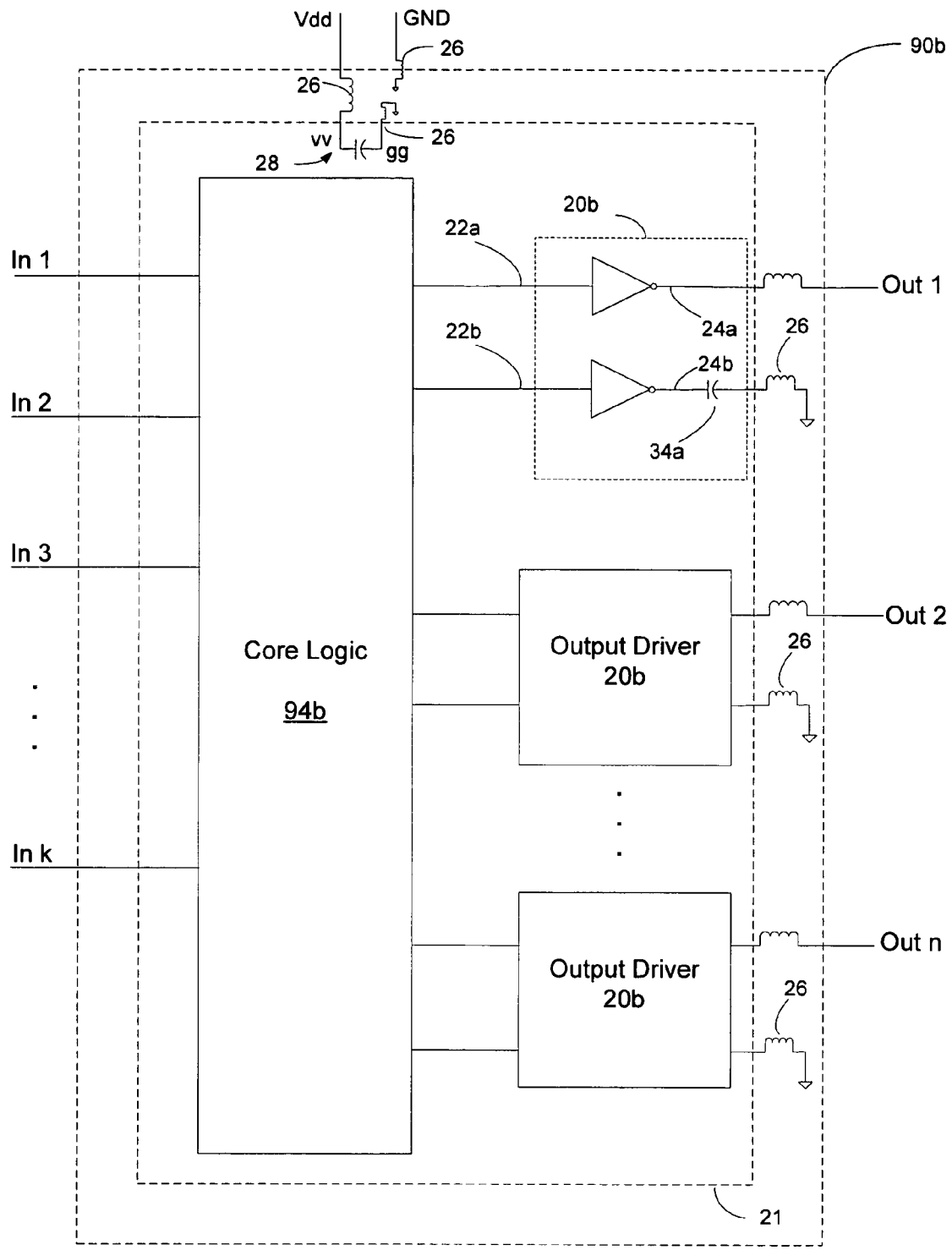

FIG. 9B depicts schematically an integrated circuit 90b according to another embodiment of the invention. The integrated circuit 90b includes core logic 94b and output drivers (or "output pads") 20b for providing output signals. According to the embodiment shown in FIG. 9B the core logic 94b, which may include CMOS logic circuits and/or circuits similar to those shown in FIG. 4A, FIGS. 12A–12G and FIG. 13, provides differential signals to the output drivers 20b. The output drivers 20b, which may include circuits shown in FIG. 4B, each provide one component of the received differential signal as an output signal via output 24a, and terminates the other component signal via output 24b and capacitor 34a. In the illustrated embodiment, the output driver 20b may include circuits shown in FIG. 4B, for instance an inverter coupled to the input 22a, and another inverter coupled to the input 22b.

Preferably, the output drivers 20b share the same chip voltage "vv" and the same chip ground "gg". However, it should be understood that in other variations the output drivers 20b may or may not share the same chip voltage "vv" or the same chip ground "gg".

Figure 9C:
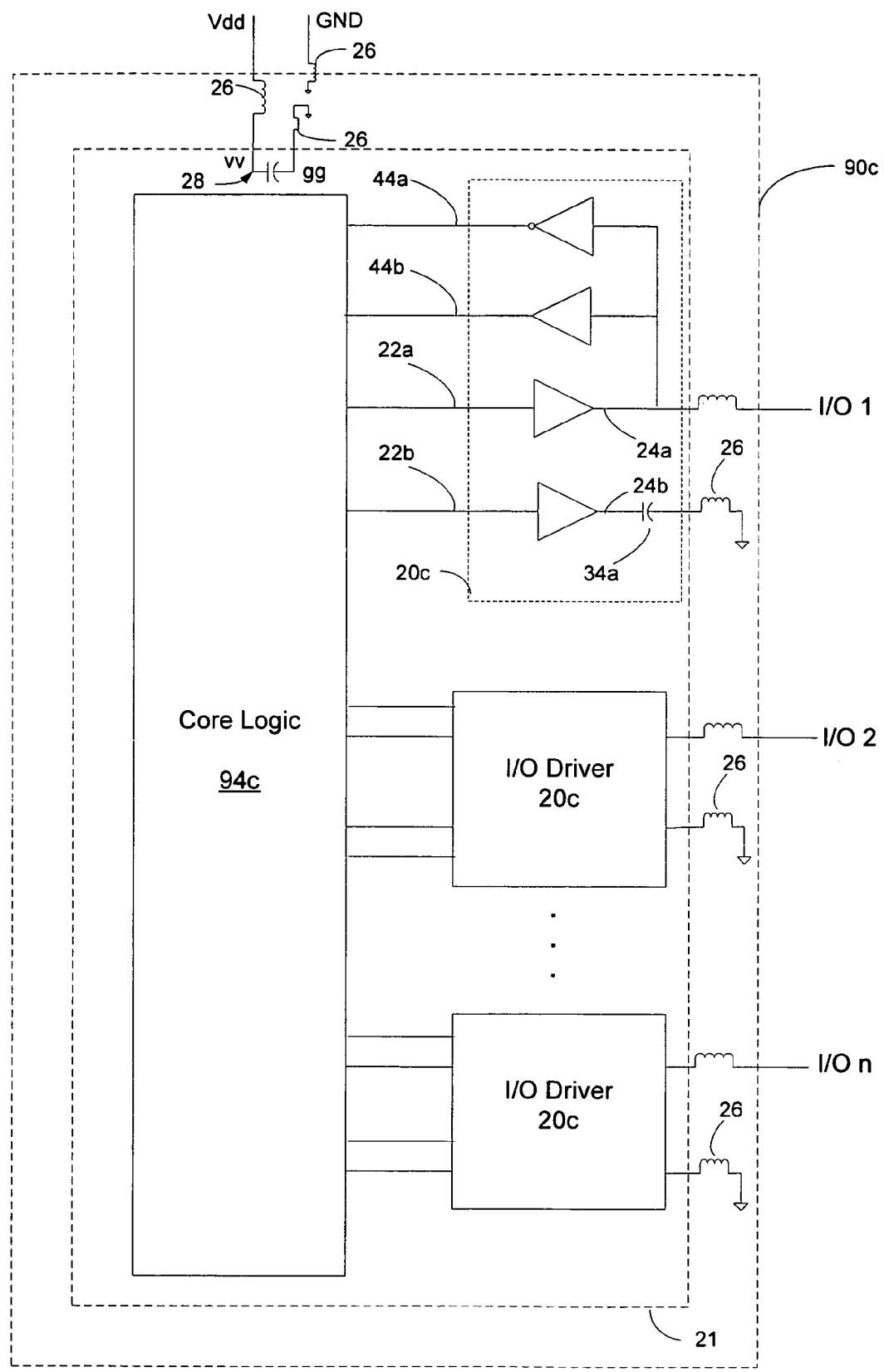

FIG. 9C depicts schematically an integrated circuit 90c according to an embodiment of the invention. The integrated circuit 90c includes core logic 94c and input and output (I/O) drivers (or "I/O pads") 20c for receiving input signals or providing output signals. The core logic 94c may include CMOS logic circuits and/or circuits similar to those shown in FIG. 4A, FIGS. 12A–12G and FIG. 13. According to the embodiment shown in FIG. 9C, an I/O driver 20c includes an input driver for receiving a signal-ended signal from an external source, and a differential signal driver for receiving a differential signal from the core logic 94 via inputs 22a–22b. The I/O driver 20c may further include a control input (not shown) for receiving a mode selection signal from the core logic 94 that dictates whether the I/O circuit 20c should be in an input mode or an output mode.

In the output mode, the I/O driver 20c, which may include circuits shown in FIG. 4B, for instance an inverter coupled to the input 22a and another inverter coupled to the input 22b, provides one of the component signal of the differential signal as an output signal via output 24a, and terminates the other component signal via output 24b and capacitor 34a. The I/O driver 20c may include circuits, for instance like those shown in FIG. 4A, for receiving a single-ended signal via the I/O pin when the driver is in input mode, and for converting the single-ended signal into a differential signal, which may be provided to the core logic 94c via connections 44a–44b.

Preferably, the I/O drivers 20c share the same chip voltage "vv" and the same chip ground "gg". However, it should be understood that in other variations the I/O drivers 20c may or may not share the same chip voltage "vv" or the same chip ground "gg".

Figure 9D:
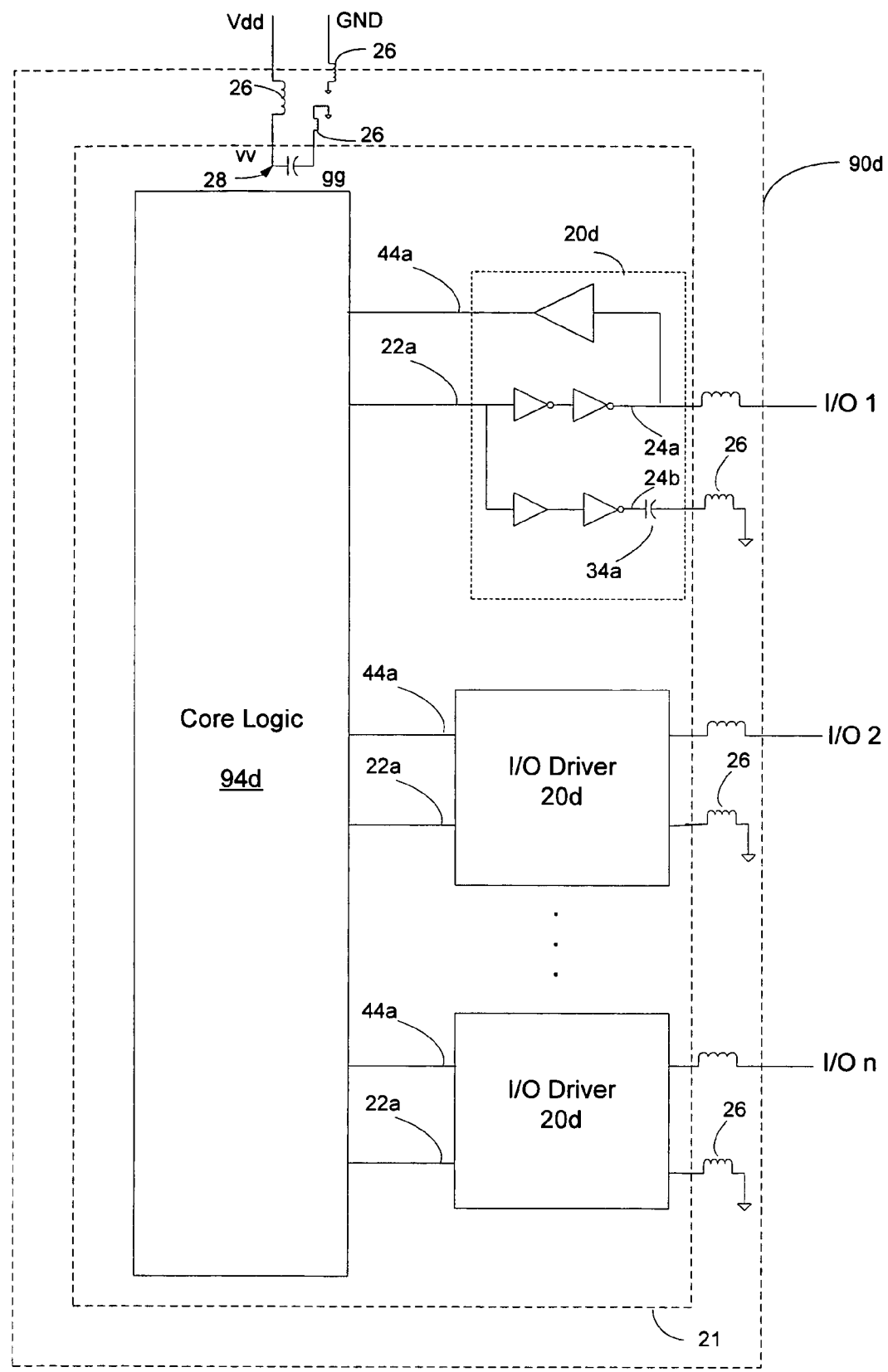

FIG. 9D depicts another embodiment of the invention that is similar to one depicted in FIG. 9C except that the core logic 94d provides and receives single-ended signals to and from I/O drivers (or "I/O pads") 20d. In this embodiment, the I/O drivers 20d may include circuits for converting single-ended signals into differential signals in an output mode, and circuits for providing signals to the core logic 94d in an input mode. Preferably, the I/O drivers 20d share the same chip voltage "vv" and the same chip ground "gg". However, it should be understood that in other variations the I/O drivers 20d may or may not share the same chip voltage "vv" or the same chip ground "gg".

Figure 10:
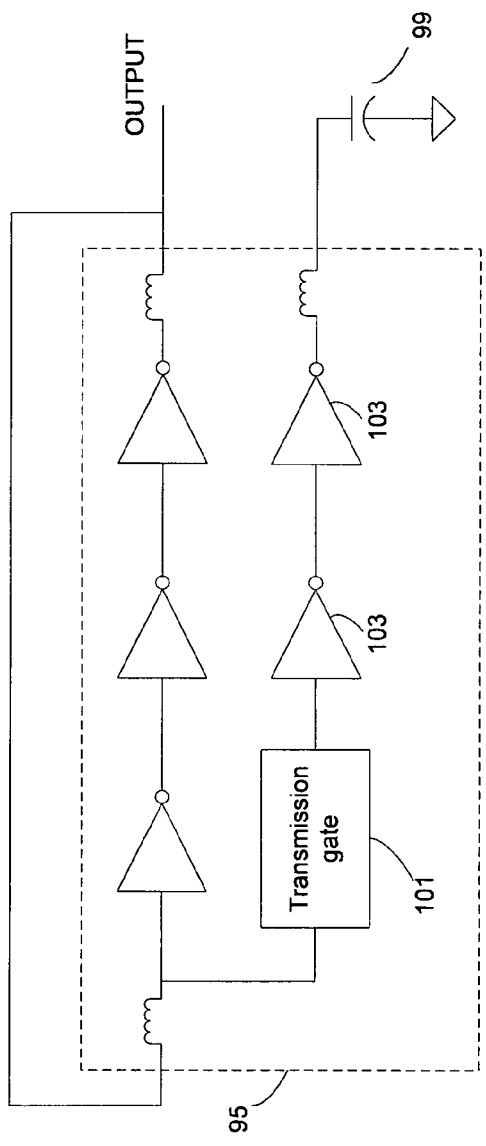
FIG. 10 depicts a ring oscillator circuit implemented according to an embodiment of the invention.

Principles of the present invention may be applied to impalement various other types of circuits. For example, a ring oscillator 95 implemented according to an embodiment of the invention is shown in FIG. 10. The ring oscillator 95 includes components found in common ring oscillators. Unlike conventional ring oscillators, however, the ring oscillator 95 includes a transmission gate 101, inverters 103, and capacitor 99 that make up a central path to direct the unused signals to package ground or system ground through a coupling capacitor. The performance of the ring oscillator 95 may be significantly better than conventional designs. In one variation, the ring oscillator disclosed herein may be implemented as a clock for a computer or other electronic devices requiring high frequency clocks.

Figure 11:
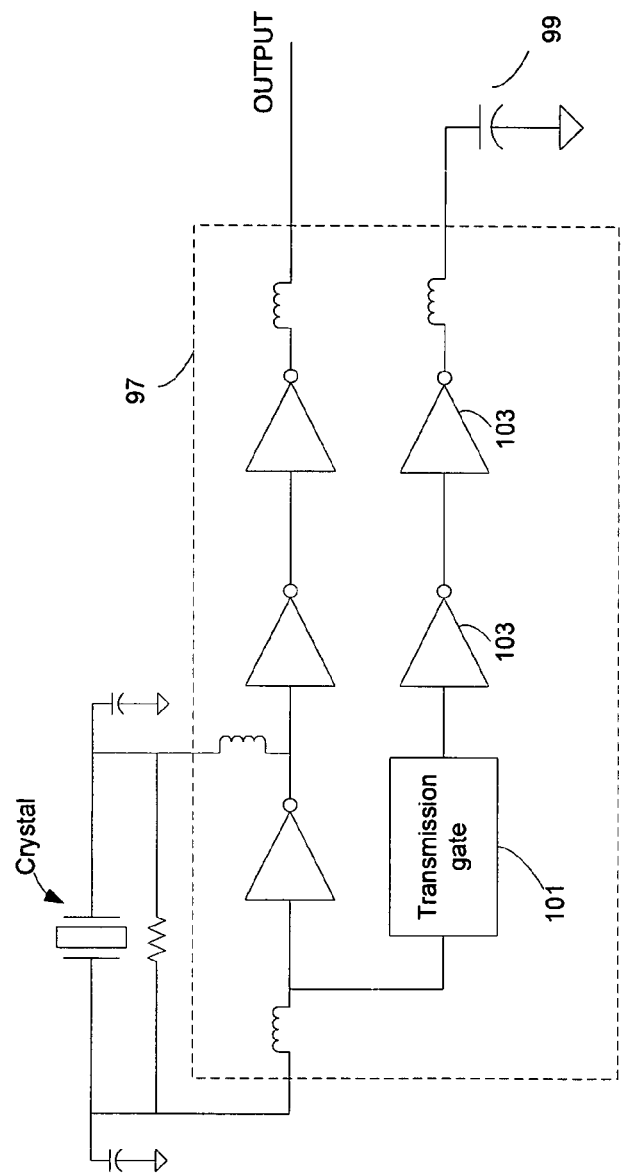
FIG. 11 depicts a crystal oscillator circuit implemented according to an embodiment of the invention.

Referring now to FIG. 11, a crystal oscillator 97 implemented according to an embodiment of the invention is shown. The crystal oscillator 97 includes components found in common crystal oscillators. Unlike conventional crystal oscillators, however, the crystal oscillator 97 includes a current path (which includes transmission gate 101, inverters 103, and capacitor 99) to direct the unused signals to the system or package ground through a coupling capacitor. The performance of the crystal oscillator 97 may be significantly better than conventional designs. In one variation, the crystal oscillator disclosed herein may be implemented as a clock for a computer or other electronic devices requiring high frequency clocks.

Figure 14:
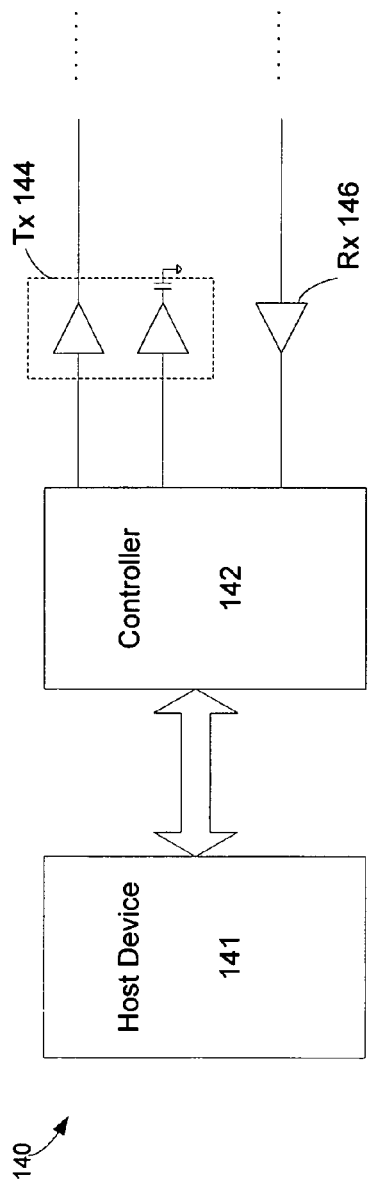
FIG. 14 depicts a high speed serial bus system that may be implemented according to an embodiment of the invention.

In a computer network system implementation, an embodiment of the differential output driver of invention may be used to enhance performance of a network interface (e.g., an Ethernet adaptor, a DSL module, etc.) by improving the network communication speed and/or by improving the maximum driving distance. Referring now to FIG. 14, there is shown a high-speed serial bus system 140 (such as Ethernet or DSL) according to an embodiment of the invention. The bus system includes a host device 141, a controller 142, a transmitter 144 and a receiver 146. In the illustrated embodiment, the transmitter 144 receives a signal from the controller 142, generates a differential signal, and provides one component signal to the bus. In accordance with an embodiment of the invention, the other component of the differential signal is terminated via a coupling capacitor. An advantage of the serial bus of FIG. 14 is that the output frequency of the transmitter 144 may be very high. If implemented using 0.35 µm TTL-CMOS or a similar technology, the output frequency may be 1 GHz or more. Furthermore, the output power of the transmitter 144 may be 3 V or more. An output power of 3 V or more may allow the signals to be carried by the signal line for a significantly longer distance than that is possible with a lower power output voltage.

Figure 15:
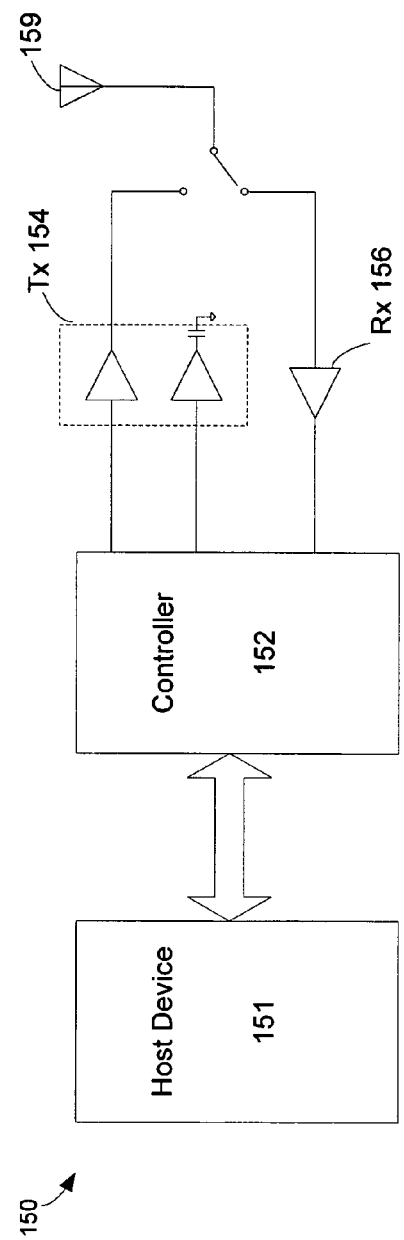
FIG. 15 depicts a high speed wireless communication system that may be implemented according to an embodiment of the invention.

Referring now to FIG. 15, there is shown a high-speed wireless communication device 150 implemented according to an embodiment of the invention. The wireless communication device includes a host device 151, a controller 152, a transmitter 154, a receiver 156, and an antenna 159. In the illustrated embodiment, the transmitter 154 receives a differential signal from the controller 152, provides one of the component signals to the antenna 159, and terminates the other. In accordance with an embodiment of the invention, the other component of the differential signal is terminated via a capacitor. An advantage of the wireless device of FIG. 15 is that the output frequency of the transmitter 154 and the power amplifier 158 may be implemented with low cost TTL-CMOS technology, as opposed to more expensive technologies such as GaAs currently used in high-speed wireless communication systems.

Attention now turns to another aspect of the invention. In this aspect of the invention, differential standard cells are used to implement at least part of the logic core of an integrated circuit such that very high speed can be achieved. For example, the second stage 420 of FIG. 4A and the core logic circuits 90a–90d of FIGS. 9A–9D may include differential standard cells of the invention. The differential standard cells may be implemented independently of the high-speed driver circuits described in this specification. Some differential standard cells according to one aspect of the invention are depicted in FIGS. 12A–12G. The following Table 1 summarizes the description of these figures.

According to an embodiment of the invention, a differential standard cell includes at least in part a pair of logically complementary circuits one of which is for performing a logic function, and another of which is for performing a logically complementary function. For example, consider the differential NAND cell shown in FIG. 12A. The differential NAND cell includes a NAND gate for performing a NAND operation on inputs A and B to produce an output value OUT. The differential NAND cell further includes a NOR gate for performing a NOR operation on inputs A_bar and B_bar to produce an output value OUT_bar that is inverse to OUT. Preferably, the differential cells share the same chip voltage "vv" and the same chip ground "gg." However, it should be understood that in other variations the differential cells may or may not share the same chip voltage "vv" or the same chip ground "gg."

TABLE 1

Figure 12A:
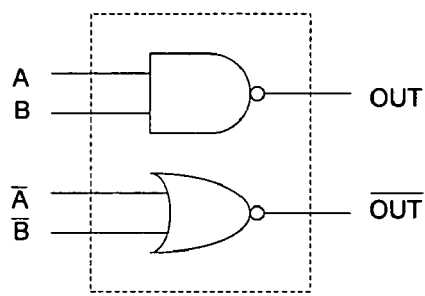
FIG. 12A-12G depict example differential standard cells according to embodiments of the invention.
Figure 12B:
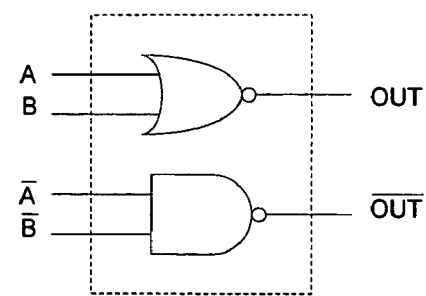
Figure 12C:
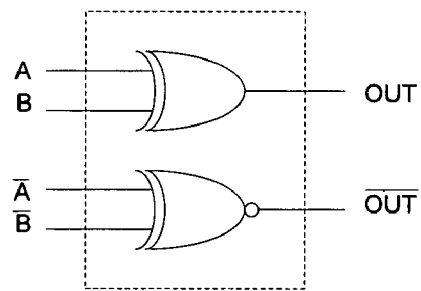
Figure 12D:
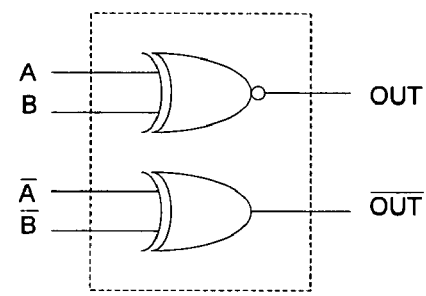
Figure 12E:
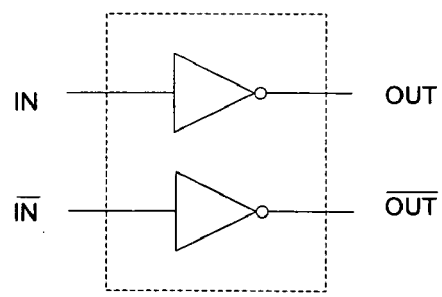
Figure 12F:
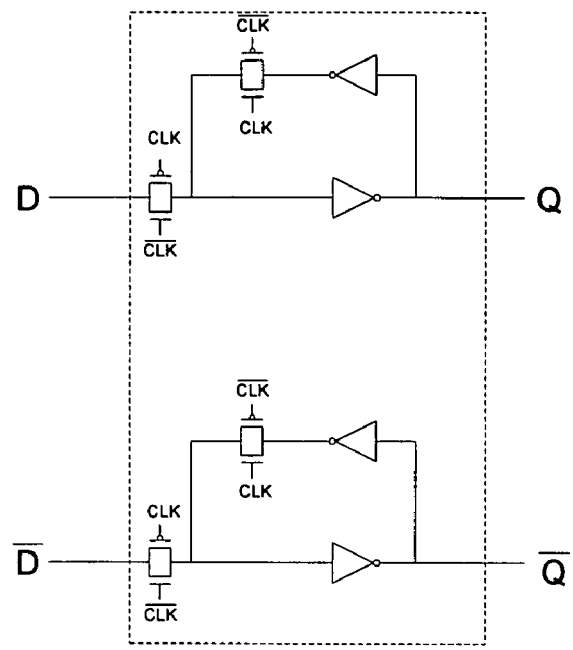
Figure 12G:
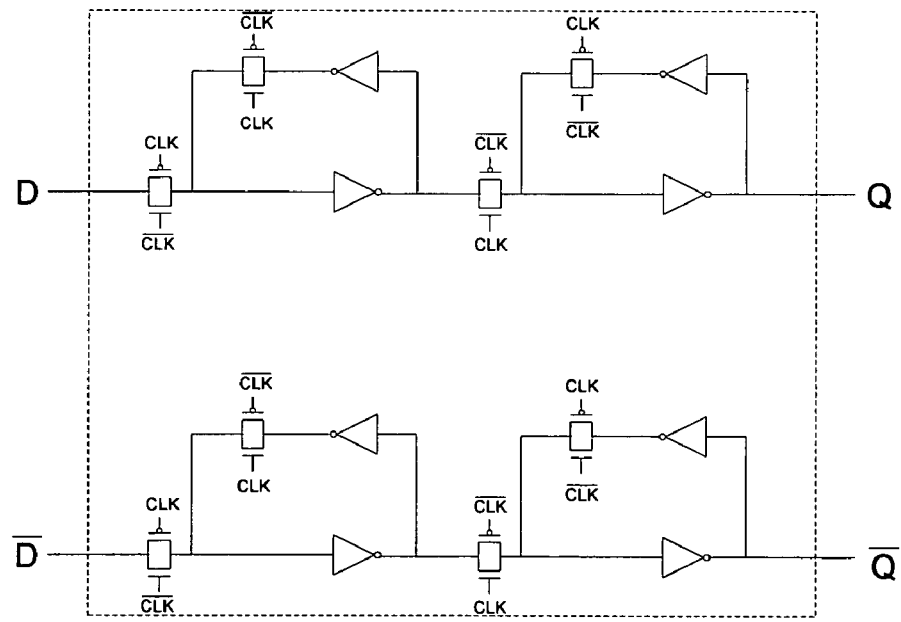

| FIG. 12A | Differential NAND cell |
|---|---|
| FIG. 12B | Differential NOR cell |
| FIG. 12C | Differential XOR cell |
| FIG. 12D | Differential XNOR cell |
| FIG. 12E | Differential NOT cell |
| FIG. 12F | Differential latch cell |
| FIG. 12G | Differential D flip flop cell |

Figure 20:
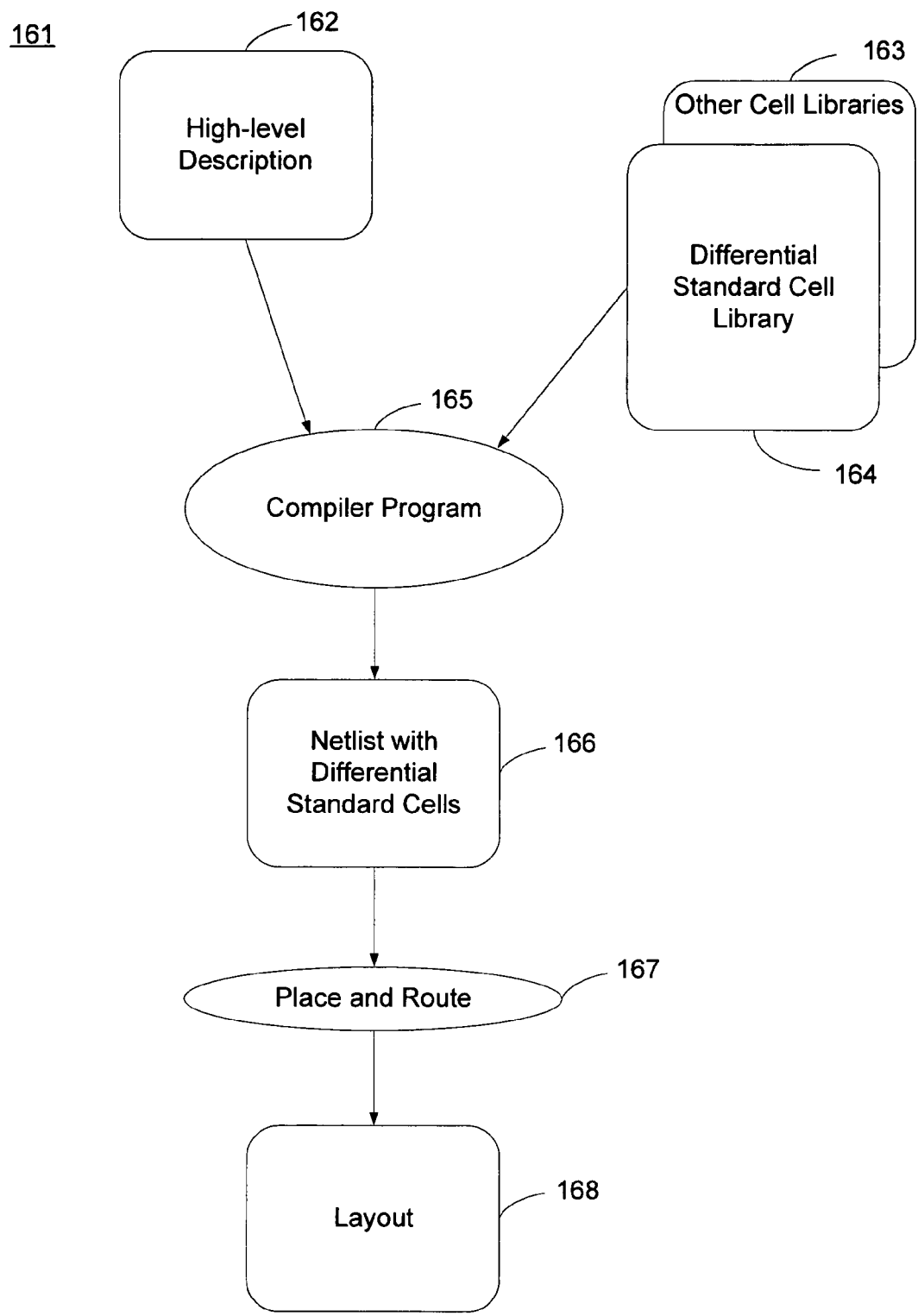
FIG. 20 is a flow diagram depicting an example IC design process according to one aspect of the present invention.

According to an embodiment of the invention, the differential standard cells are considered building blocks or "primitive cells" of an integrated circuit design, and they may be used by an automated electronic design process to produce an integrated circuit. A flow diagram depicting an IC design process 161 according to one aspect of the invention is shown in FIG. 20. The process 161 described with respect to this flow chart is implemented within a computer system in a CAD (computer automated design) environment. Within the process 161, a circuit designer first generates a high-level description 162 of a circuit in a hardware description language such as Verilog.

A computer-implemented compiler program 165 processes this high-level description 162 and generates therefrom a detailed list of logic components and the interconnections between these components. This list is called a "netlist" 166. The components of the netlist 166 can include primitive cells such as full-adders, NAND gates, NOR gates, XOR gates, latches, and D-flip flops, etc. According to an embodiment of the invention, the netlist 166 includes differential standard cells, such as those described above with reference to FIGS. 12A–12G, as primitive cells.

In processing the high-level description, the compiler program 165 may first generate a netlist of generic primitive cells that are technology independent. According to one embodiment of the invention, the compiler 165 may then apply a Differential Standard Cell Library 164 and/or other cell libraries 163 to this generic netlist in order to generate a netlist 166 that contains differential standard cells. For example, if the generic netlist includes a NAND gate, then the compiler 165 may map a differential NAND cell to the NAND gate to produce a netlist that includes a NAND gate and a NOR gate.

The netlist 166, however, does not contain any information with respect to the physical design of the circuit. For example, the netlist 166 does not specify where the cells are placed on a circuit board or silicon chip, or where the interconnects run. Determining this physical design information is the function of a computer controlled place-and-route process 167.

The place-and-route process 167 first finds a location for each cell on a circuit board or silicon chip. The locations are typically selected to optimize certain objectives such as wire length, circuit speed, power consumption, and/or other criteria, and subject to the condition that the cells are spread evenly over the circuit board or silicon chip and that the cells do not overlap with each other. The place-and-route process 167 also generates the wire geometry based on the placement information for connecting the pins of the cells together. The output of the place-and-route process 167 includes cell placement data structures and wire geometry data structures that are used to make the final geometric database needed for fabrication of the circuit. The placement and wire geometry data structures of the design are sometimes referred to as a "layout" 168. The layout 168 can be regarded as a template for the fabrication of the physical embodiment of the integrated circuit using transistors, routing resources, etc.

Due to the requirement of additional gates, it is expected circuits containing differential standard cells of the invention may require more die area than circuits implementing a similar logic function without using differential standard cells. An example half-adder circuit 160 according to an embodiment of the invention is illustrated in FIG. 16. Note that the half-adder circuit 160 includes two i inputs for receiving A and B, and two inputs for receiving the complements of A and B. The half-adder circuit 160 further includes an output for providing C_out and another output for providing the complement or inverse of C_out. The circuit 160 may be implemented with a differential NAND cell, a differential XOR cell, and a differential NOT cell. Note that a portion of the circuit 160, which is used for producing the inverse of C_out, is logically complementary to the portion that is responsible for generating C_out. Also note that in FIG. 16, a NAND gate, a XOR gate, and a NOT gate in one portion of the circuit are mirrored by a NOR gate, an XNOR gate, and a NOT gate, respectively, in the complementary portion of the circuit.

Figure 17:
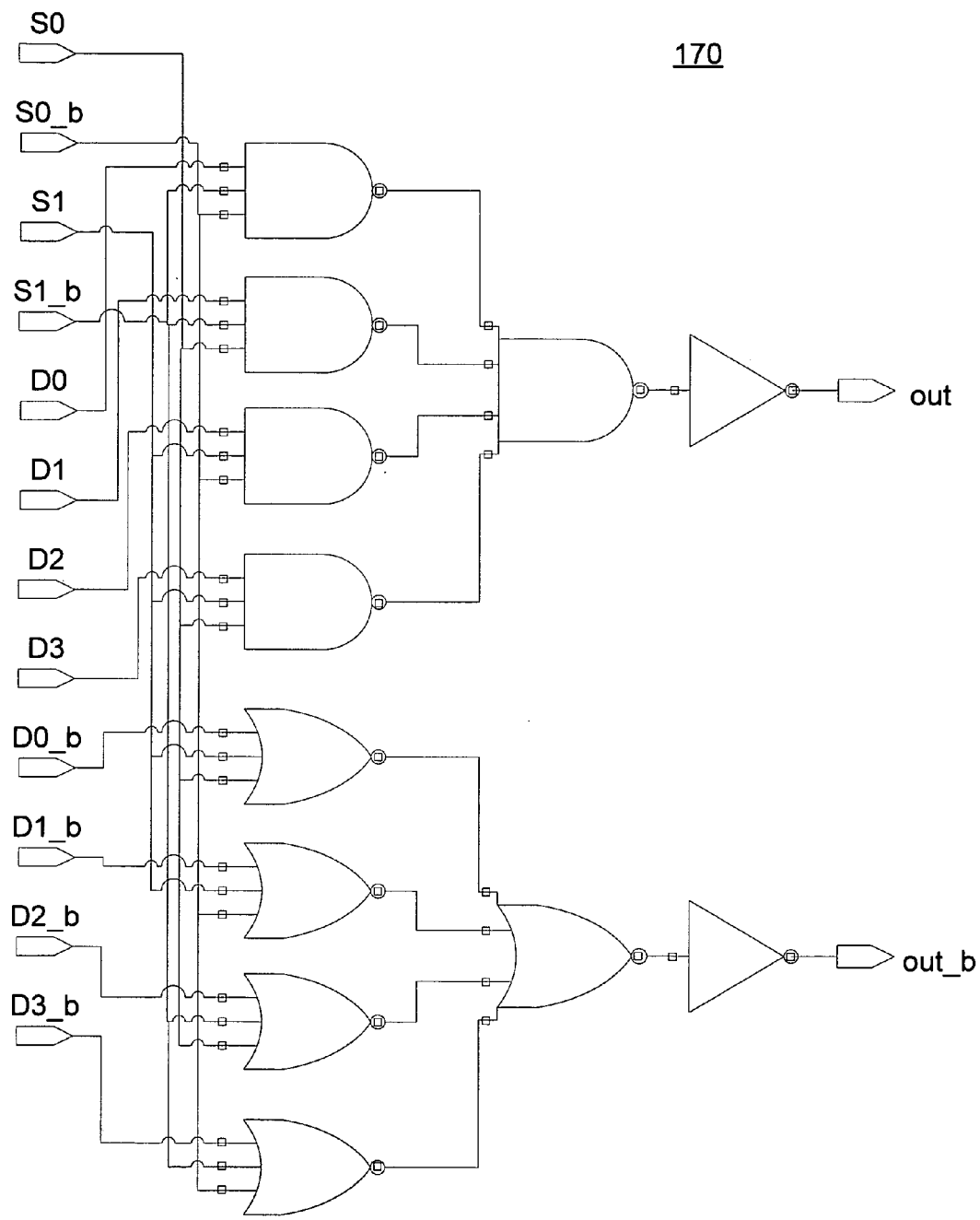
FIG. 17 depicts an example 4-to-1 multiplexer circuit implemented according to an embodiment of the invention.

An example 4-to-1 multiplexer circuit 170 according to an embodiment of the invention is illustrated in FIG. 17. The multiplexer circuit 170 includes one set of inputs for receiving data and another set of inputs for receiving the complements of the data. Furthermore, the multiplexer circuit 170 includes two outputs for providing an output value and its complement. The circuit 170 may be implemented with differential NAND cells and a differential NOT cell. Note that a portion of the circuit 170, which is used for producing out_b, is logically complementary to the portion that is responsible for generating "out." Also note that in FIG. 17, NAND gates in one portion of the circuits are mirrored by NOR gates in the complementary portion of the circuit.

A diagram illustrating an example gate-level implementation a differential NAND cell of FIG. 12A is shown in FIG. 18. A diagram illustrating an example gate-level implementation a differential NOR cell of FIG. 12B is shown in FIG. 19. These implementation diagrams are shown for illustration purposes only. In light of the present disclosure, a person skilled in the art would realize that the differential standard cells may be implemented in many different ways. One of ordinary skill in the art having the benefit of the disclosure herein would appreciate that most logic circuits in the market may be reconfigured with the differential cells described herein such that complementary circuitry is provided to improve overall circuit performance. It should be understood that the differential circuits described herein may be used to implement various portions of an integrated circuit and that applications of the differential circuit should not be limited to the second stage 420, or core logic 90a–90d.

Embodiments of the invention have thus been disclosed. The foregoing descriptions of specific embodiments of the invention are presented for purposes of illustration and explanation. The embodiments were chosen and described in order to best explain the principles of the invention and its practical applications, to thereby enable others skilled in the art to best utilize the invention. They are not intended to be exhaustive or to limit the invention to the precise forms disclosed. Various modifications may occur to those skilled in the art having the benefit of this disclosure without departing from the inventive concepts described herein. Accordingly, it is the claims, not merely the foregoing illustration, that are intended to define the exclusive rights of the invention.

Furthermore, throughout this specification (including the claims), unless the context requires otherwise, the word "comprise", or variations such as "comprises" or "comprising", will be understood to imply the inclusion of a stated element or group of elements but not the exclusion of any other elements or group of elements. The word "include," or variations such as "includes" or "including," will be understood to imply the inclusion of a stated element or group of elements but not the exclusion of any other element or group of elements. Claims that do not contain the terms "means for" and "step for" are not intended to be construed under 35 U.S.C. §112, paragraph 6.

What is claimed is:

1. A driver, comprising:
    a first input and a second input for receiving a differential signal;
    a first output coupled to the first input to provide the first component signal as an output signal of the output driver; and
    a second output coupled to the second input to receive a second component signal of the differential signal, and wherein the second output is configured to terminate the second component signal.

2. The driver of claim 1, wherein the second output is configured to be coupled to package ground via an impedance.

3. The driver of claim 2, wherein the impedance matches a load impedance of the first output.

4. The driver of claim 2, wherein the impedance comprises an inductor.

5. The driver of claim 2, wherein the impedance comprises a resistor.

6. The driver of claim 2, wherein the impedance comprises a capacitor.

7. The driver of claim 1, wherein the second output is configured to be coupled to a voltage source via an impedance.

8. The driver of claim 7, wherein the impedance matches a load impedance of the first output.

9. The driver of claim 7, wherein the impedance comprises an inductor.

10. The driver of claim 7, wherein the impedance comprises a resistor.

11. The driver of claim 7, wherein the impedance comprises a capacitor.

12. The driver of claim 1, further comprising a converter circuit coupled to receive a single-ended signal and configured to convert a single-ended signal into the differential signal.

13. The driver of claim 12, wherein the converter circuit comprises:
    an inverter circuit configured to receive the single-ended signal and to provide an inverted input signal; and
    a RC delay circuit configured to receive the single-ended signal and to provide a delayed input signal, wherein RC characteristics of the RC delay circuit generally match those of the inverter circuit.

14. The driver of claim 12, wherein the converter circuit comprises:
an inverter circuit configured to receive the single-ended signal and to provide an inverted input signal; and
a transmission gate configured to receive the single-ended signal and to provide a delayed input signal.

15. The driver of claim 14, further comprising an electro-static discharge protection circuit coupled to the transmission gate.

16. The driver of claim 15, wherein the electro-static discharge protection circuit comprises a five volt I/O tolerant electro-static discharge protection circuit.

17. The driver of claim 12, wherein the first input comprises a first inverter circuit.

18. The driver of claim 17, wherein the second input comprises a second inverter circuit.

19. The driver of claim 1, further comprising:
a converter circuit coupled to receive a single-ended signal and configured to convert a single-ended signal into a first differential signal; and
circuits coupled to process the first differential signal to produce the differential signal.

20. The driver of claim 1, wherein the second output is coupled to a capacitor, and wherein the capacitor is located inside the integrated circuit package.

21. The driver of claim 20, wherein the driver and the capacitor are located on a same die.

22. An integrated circuit, comprising:
circuits for performing one or more logic functions; and
a plurality of drivers coupled to the circuits,
wherein at least one of the drivers comprises comprise a first output and a second output for providing a differential signal,
wherein the first output is coupled to provide a first component of the differential signal to a pin of the integrated circuit that is designated for signal communication, and
wherein the second output is coupled to provide a second component of the differential signal to one or more pins of the integrated circuit that are not designated for signal communication.

23. The integrated circuit of claim 22, wherein the second outputs are coupled to one another.

24. The integrated circuit of claim 22, wherein the second outputs are coupled to one or more pins of the integrated circuit designated to be coupled to system ground.

25. The integrated circuit of claim 24, wherein the second outputs are coupled to a package ground plane of the integrated circuit.

26. The integrated circuit of claim 22, wherein the one or more drivers each comprise a first input and a second input for receiving the differential signal from the circuits.

27. The integrated circuit of claim 22, wherein the one or more drivers each comprise a converter circuit coupled to receive a single-ended signal from the circuits and to convert the single-ended signal into the differential signal.

28. The integrated circuit of claim 22, wherein at least some of the drivers are powered by a same chip voltage and a same chip ground.

29. The integrated circuit of claim 22, wherein at least some of the drivers are powered by different chip grounds and different chip voltages.

30. The integrated circuit of claim 22, wherein at least some of the drivers are powered by a same chip ground but are coupled to different chip voltages.

31. The integrated circuit of claim 22, wherein at least some of the drivers are powered by a same chip voltage but are coupled to different chip grounds.

32. The integrated circuits of claim 28, further comprising a decoupling capacitor coupled to the same chip voltage and the same chip ground.

33. The integrated circuit of claim 28, further comprising:
a first decoupling capacitor coupled to a first chip ground and a first chip voltage; and
a second decoupling capacitor coupled to a second chip ground and a second chip voltage.

34. The integrated circuit of claim 30, further comprising:
a first decoupling capacitor coupled to the chip ground and a first chip voltage; and
a second decoupling capacitor coupled to the chip ground and a second chip voltage.

35. The integrated circuit of claim 31, further comprising:
a first decoupling capacitor coupled to the chip voltage and a first chip ground; and
a second decoupling capacitor coupled to the chip voltage and a second chip ground.

36. The integrated circuit of claim 22, wherein the circuits are coupled to be powered by a same chip voltage and a same chip ground.

37. The integrated circuit of claim 22, wherein the circuits are coupled to be powered by different chip voltages and different chip grounds.

38. The integrated circuit of claim 22, wherein the circuits are coupled to be powered by a same chip ground but different chip voltages.

39. The integrated circuit of claim 22, wherein the circuits are coupled to be powered by a same chip voltage but different chip grounds.

40. The integrated circuit of claim 22, further comprising a decoupling capacitor connected to a chip voltage and a chip ground, wherein the chip voltage and the chip ground are coupled to power the circuits.

41. The integrated circuit of claim 40, wherein the decoupling capacitor is located on a same die as the circuits and the plurality of drivers.

42. The integrated circuit of claim 40, wherein the circuits and the plurality of drivers are located on a die, and wherein the decoupling capacitor is located outside the die.

43. The integrated circuit of claim 40, wherein at least some of the circuits are configured to process differential signals.

44. The integrated circuit of claim 43, wherein at least some of the circuits comprise one or more differential standard cells each configured to process differential signals.

45. The integrated circuit of claim 44, wherein the differential standard cells comprise a differential NAND gate.

46. The integrated circuit of claim 44, wherein the differential standard cells comprise a differential NOR gate.

47. The integrated circuit of claim 44, wherein the differential standard cells comprise a differential XOR gate.

48. The integrated circuit of claim 44, wherein the differential standard cells comprise a differential XNOR gate.

49. The integrated circuit of claim 44, wherein the differential standard cells comprise a differential NOT gate.

50. The integrated circuit of claim 44, wherein the differential standard cells comprise a differential latch.

51. The integrated circuit of claim 44, wherein the differential standard cells comprise a differential D flip flop.

52. The integrated circuit of claim 44, wherein the differential standard cells comprise a differential comparator.

53. The integrated circuit of claim 40, wherein at least some of the circuits are configured to process single-ended signals.

54. The integrated circuit of claim 53, wherein at least some of the circuits are configured to process differential signals.

55. An integrated circuit, comprising:
circuits for performing one or more logic functions; and
a driver coupled to the circuits,
wherein the driver comprises comprise a first output and a second output for providing a differential signal,
wherein the first output is coupled to provide a first component of the differential signal to a pin of the integrated circuit that is designated for signal communication, and
wherein the second output is coupled to provide a second component of the differential signal to one or more pins of the integrated circuit that are not designated for signal communication.

56. The integrated circuit of claim 55, wherein the second output is coupled to one or more pins of the integrated circuit designated to be coupled to system ground.

57. The integrated circuit of claim 56, wherein the second output is coupled to a package ground plane of the integrated circuit.

58. The integrated circuit of claim 55, wherein the driver comprises a first input and a second input for receiving the differential signal from the circuits.

59. The integrated circuit of claim 55, wherein the driver comprises a converter circuit coupled to receive a single-ended signal from the circuits and to convert the single-ended signal into the differential signal.

60. The integrated circuits of claim 55, further comprising a decoupling capacitor coupled to a chip voltage and a chip ground.

61. The integrated circuit of claim 60, wherein the chip voltage and the chip ground are coupled to power the circuits.

62. The integrated circuit of claim 60, wherein the decoupling capacitor is located on a same die as the driver.

63. The integrated circuit of claim 60, wherein the circuits and the driver are located on a die, and wherein the decoupling capacitor is located outside the die.

64. The integrated circuit of claim 55, further comprising:
an input for receiving an input signal and providing the input signal to the circuits; and
wherein the first output is configured to be coupled to the input to form an oscillator circuit.

65. The integrated circuit of claim 55, further comprising:
an input for receiving an input signal; and
wherein the input and the first output are configured to be coupled to a crystal to form a crystal oscillator circuit.

66. The integrated circuit of claim 64, wherein the circuits comprise a plurality of inverter circuits, and further wherein the plurality of inverter circuits comprise an odd number of inverter circuits.

67. The integrated circuit of claim 65, wherein the circuits comprise a plurality of inverter circuits, and further wherein the plurality of inverter circuits comprise an odd number of inverter circuits.

* * * * *